United States Patent
Kim et al.

(10) Patent No.: US 9,859,387 B2
(45) Date of Patent: Jan. 2, 2018

(54) SEMICONDUCTOR DEVICE HAVING CONTACT PLUGS

(71) Applicant: Samsung Electronics Co., Ltd., Suwon-si (KR)

(72) Inventors: Jin Bum Kim, Seoul (KR); Chul Sung Kim, Seongnam-si (KR); Kang Hun Moon, Incheon (KR); Yang Xu, Suwon-si (KR); Bon Young Koo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/990,793

(22) Filed: Jan. 8, 2016

(65) Prior Publication Data
US 2016/0293717 A1    Oct. 6, 2016

(30) Foreign Application Priority Data

Apr. 6, 2015    (KR) .................. 10-2015-0048181

(51) Int. Cl.
| | |
|---|---|
| *H01L 27/088* | (2006.01) |
| *H01L 29/417* | (2006.01) |
| *H01L 29/78* | (2006.01) |
| *H01L 29/08* | (2006.01) |
| *H01L 29/161* | (2006.01) |
| *H01L 29/36* | (2006.01) |
| *H01L 29/45* | (2006.01) |

(Continued)

(52) U.S. Cl.
CPC .... *H01L 29/41791* (2013.01); *H01L 29/0847* (2013.01); *H01L 29/161* (2013.01); *H01L 29/36* (2013.01); *H01L 29/41758* (2013.01); *H01L 29/45* (2013.01); *H01L 29/66795* (2013.01); *H01L 29/785* (2013.01); *H01L 27/1104* (2013.01); *H01L 29/0673* (2013.01); *H01L 29/775* (2013.01)

(58) Field of Classification Search
CPC . H01L 29/785; H01L 29/41791; H01L 29/45; H01L 27/0886; H01L 29/161
USPC ............................................................ 257/401
See application file for complete search history.

(56) References Cited

U.S. PATENT DOCUMENTS

| | | | |
|---|---|---|---|
| 7,425,500 | B2 | 9/2008 | Metz et al. |
| 7,554,165 | B2 | 6/2009 | Hokazono |

(Continued)

FOREIGN PATENT DOCUMENTS

KR    10-0853653    7/2008

*Primary Examiner* — David Vu
*Assistant Examiner* — Brandon Fox
(74) *Attorney, Agent, or Firm* — Muir Patent Law, PLLC

(57) ABSTRACT

A semiconductor device includes a substrate having an upper surface, a plurality of active fins on the substrate, a gate electrode crossing the plurality of active fins, and at each side of the gate electrode, a source/drain region on the plurality of active fins. The source/drain region may include a plurality of first regions extending from the active fins, and a second region between each of the plurality of first regions. The second region may have a second germanium concentration greater than the first germanium concentration. The source/drain region may be connected to a contact plug, and may have a top surface that has a wave shaped, or curved surface. The top surface may have a larger surface area than a top surface of the contact plug.

17 Claims, 26 Drawing Sheets

(51) Int. Cl.
  *H01L 29/66* (2006.01)
  *H01L 27/11* (2006.01)
  *H01L 29/775* (2006.01)
  *H01L 29/06* (2006.01)

(56) References Cited

U.S. PATENT DOCUMENTS

| | | |
|---|---|---|
| 7,692,254 B2 | 4/2010 | Anderson et al. |
| 7,898,041 B2 | 3/2011 | Radosavljevic et al. |
| 7,910,994 B2 | 3/2011 | Yu et al. |
| 7,915,693 B2 | 3/2011 | Okano |
| 8,043,920 B2 | 10/2011 | Chan et al. |
| 8,116,121 B2 | 2/2012 | Kawasaki |
| 8,211,761 B2 | 7/2012 | Tan et al. |
| 8,263,451 B2 | 9/2012 | Su et al. |
| 8,460,990 B2 | 6/2013 | Kim et al. |
| 8,623,728 B2 | 1/2014 | Chang et al. |
| 8,759,184 B2 | 6/2014 | Ho et al. |
| 8,796,093 B1 | 8/2014 | Cheng et al. |
| 9,318,578 B2 * | 4/2016 | Basker .............. H01L 29/66795 |
| 2006/0216880 A1 | 9/2006 | Suto |
| 2007/0148837 A1 | 6/2007 | Shah et al. |
| 2008/0111197 A1 | 5/2008 | Mikasa |
| 2011/0073952 A1 | 3/2011 | Kwok et al. |
| 2011/0079855 A1 | 4/2011 | Chan et al. |
| 2011/0298058 A1 | 12/2011 | Kawasaki et al. |
| 2014/0001520 A1 * | 1/2014 | Glass ................ H01L 29/66439 257/288 |
| 2014/0131776 A1 | 5/2014 | Ching et al. |
| 2014/0197458 A1 | 7/2014 | Ching et al. |
| 2014/0264279 A1 | 9/2014 | Cheng et al. |
| 2015/0035023 A1 * | 2/2015 | Kim ..................... H01L 29/785 257/288 |

\* cited by examiner

SEMICONDUCTOR DEVICE HAVING CONTACT PLUGS

CROSS-REFERENCE TO RELATED APPLICATIONS

This U.S. non-provisional patent application claims priority under 35 U.S.C. §119 to Korean Patent Application No. 10-2015-0048181 filed on Apr. 6, 2015 in the Korean Intellectual Property Office (KIPO), the contents of which are herein incorporated by reference in their entirety.

BACKGROUND

The present disclosure relates to semiconductor devices having contact plugs. Recently, semiconductor devices tend to be highly integrated. Therefore, the size of contact plugs has been continuously reduced and contact resistance becomes one of many important factors affecting the reliability of the semiconductor devices.

SUMMARY

Example embodiments of the inventive concepts provide a semiconductor device having contact plugs.

According to certain example embodiments of the present inventive concepts, a semiconductor device includes a substrate, a plurality of active fins on the substrate, a gate electrode crossing the plurality of active fins, a first source/drain region on the plurality of active fins at a first side of the gate electrode, and a second source/drain region on the plurality of active fins at a second, opposite side of the gate electrode. At least one of the first or second source/drain region includes a plurality of first regions disposed on the active fins and having a first germanium concentration, and a second region between the first regions, such that the first regions are between second region and the substrate, the second region having a second germanium concentration greater than the first germanium concentration.

In example embodiments, the plurality of first regions may have a plurality of inclined planes with respect to an upper surface of the substrate, and the second region is disposed on the plurality of inclined planes.

In example embodiments, at least a cross-sectional portion of the plurality of first regions may have a pentagonal shape, and at least some of the first regions may be connected to each other by the second region.

In example embodiments, the second germanium concentration may be equal to or greater than about 50 atomic percentage (at. %).

In example embodiments, the first and second regions may include a silicon germanium epitaxial layer.

In example embodiments, the semiconductor device may further comprise a contact plug on the first source/drain region. A lower surface of the contact plug may have a plurality of curves along an upper surface of the first source/drain region.

In example embodiments, the first source/drain region may have a recessed upper portion, and the lower surface of the contact plug may be connected to the recessed upper portion of the first source/drain region.

In example embodiments, the lower surface of the contact plug may be electrically connected to an upper portion of the second region.

In example embodiments, the semiconductor device may further include a silicide layer between the contact plug and the source/drain region.

In example embodiments, each of the active fins may have a recessed region, and each of the first regions of source/drain region may be on the recessed region of each of the active fins.

In example embodiments, the first and second regions may include an impurity. The second region may have an impurity concentration greater than an impurity concentration of the first region.

In example embodiments, the impurity may be boron (B) or phosphorus (P).

In example embodiments, the source/drain region may further comprise a third region on the upper surfaces of the first and second regions.

In example embodiments, the third region may have a germanium concentration less than that of the second region.

In an example embodiment of the present inventive concepts, a semiconductor device includes a substrate, a plurality of active fins on the substrate, a gate electrode crossing the plurality of active fins, a first source/drain region on the plurality of active fins at a first side of the gate electrode, the first source/drain region having an impurity, and a second source/drain region on the plurality of active fins at a second side of the gate electrode, the second source/drain region having an impurity. The first the source/drain region includes a plurality of first regions extending from the active fins and having a first material concentration of a first material, and a second region between at least some of the first regions and having a second material concentration of the first material greater than the first material concentration, wherein the second region does not contact the substrate.

In example embodiments, the first material may be germanium (Ge), boron (B), or phosphorus (P).

In an example embodiment of the present inventive concepts, a semiconductor device includes a substrate having a first active fin and a second active fin, a gate electrode crossing the first and second active fins, on each side of the gate electrode, a first source/drain region on the first active fin, the first source/drain region having a first germanium concentration, on each side of the gate electrode, a second source/drain region on the second active fin, the second source/drain region having a second germanium concentration, on each side of the gate electrode, a connection region connecting the corresponding first source/drain region and second source/drain region, and on each side of the gate electrode, a third source/drain region on the connection region. The third source/drain region may have a third germanium concentration greater than either of the first and second germanium concentrations.

In example embodiments, the semiconductor device may further comprise, on each side of the gate electrode, a contact plug on the first through third source/drain regions. A lower surface of each contact plug may have one or more curves.

Aspects of the invention may be described in different ways. For example, in example embodiments, a semiconductor device includes a substrate, a plurality of active fins on the substrate extending in a first direction, a gate electrode structure crossing the plurality of active fins to extend in a second direction, a first source/drain region on a first side of the gate electrode structure, wherein a bottom of the first source/drain region extends from the plurality of active fins, and a second source/drain region on a second, opposite side of the gate electrode structure, wherein a bottom of the second source/drain region extends from the plurality of active fins. A a top surface of at least the first source/drain region may have a wave shape.

In some embodiments, the semiconductor device includes a first contact plug extending upward from the top surface of the first source/drain region. The first contact plug may have a bottom surface that has a wave shape corresponding to the wave shape of the top surface of the first source/drain region. The first contact plug may have a top surface that has a planar shape. For example, the top surface may be opposite the bottom surface, and the bottom surface of the first contact plug may have a greater surface area than the top surface of the first contact plug. In some embodiments, the surface area of the bottom surface of the first contact plug is at least 5% greater than the surface area of the top surface of the contact plug.

In some embodiments, the first source/drain region has at least first sub-regions and second sub-regions, each sub-region including germanium and having a germanium concentration, and the first sub-regions extend closer to the substrate than the second sub-regions and have a germanium concentration less than the germanium concentration of the second sub-regions. The first sub-regions may have a plurality of inclined planes with respect to a top surface of the substrate, and each second sub-region may be disposed between two adjacent first sub-regions. For example, adjacent ones of the first sub-regions are merged with one another.

In some embodiments, the first sub-regions and second sub-regions each include silicon germanium (SiGe). In addition, the first sub-regions may include an impurity having a first concentration and the second sub-regions may include an impurity having a second concentration different from the first concentration.

Different elements described herein may be described using different terms that convey varied scope.

The example embodiments described in this summary include various overlapping concepts, many of which may be combined with others in different manners.

BRIEF DESCRIPTION OF THE DRAWINGS

The above aspects and features of the present inventive concepts will become more apparent by describing in detail exemplary embodiments thereof with reference to the attached drawings, in which.

DETAILED DESCRIPTION

Figure 1:
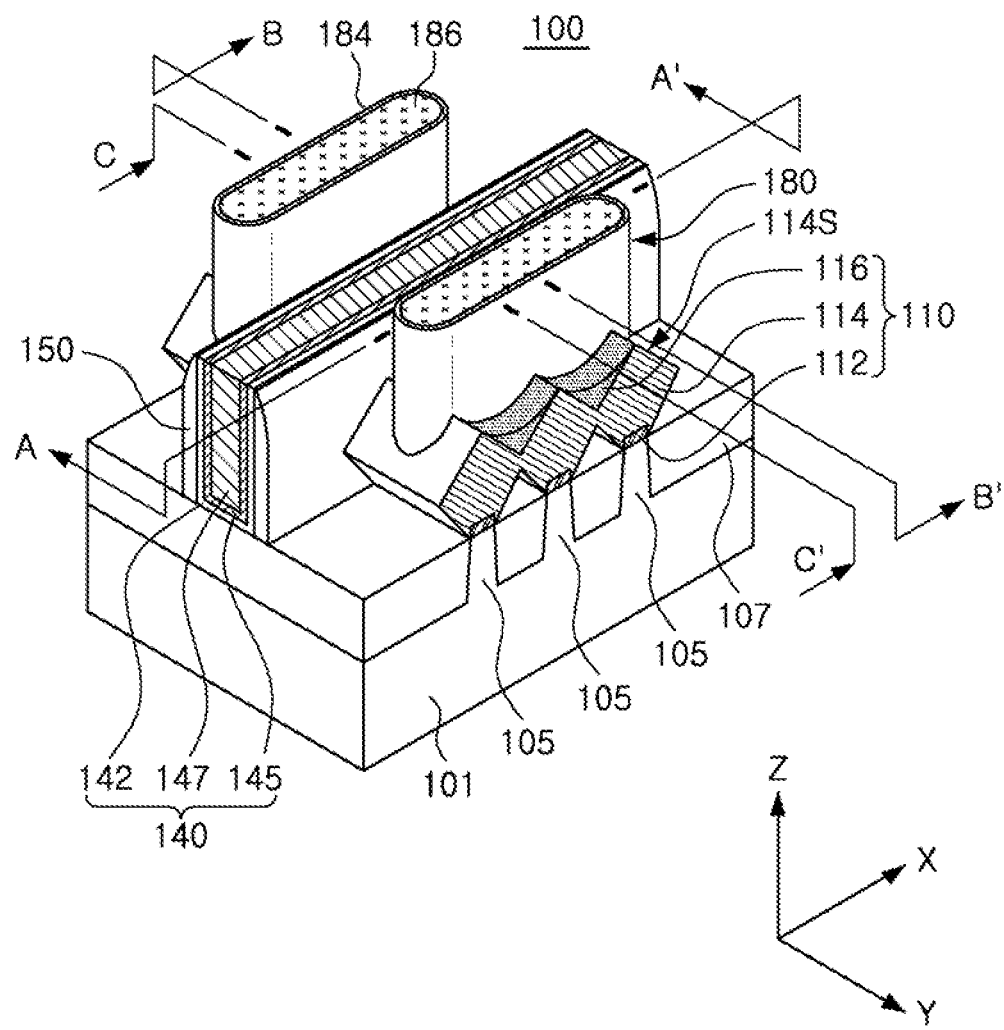
FIG. 1 is a perspective view illustrating a semiconductor device according to some example embodiments of the inventive concepts.

Example embodiments of the inventive concepts will now be described more fully hereinafter with reference to the accompanying drawings; however, they may be embodied in different forms and should not be construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. However, a passive electrically conductive component directly electrically connected to a semiconductor material may be electrically connected to the component formed of that material. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below in one part of the specification could be termed a second element, component, region, layer or section in another part of the specification without departing from the teachings of example embodiments. In addition, in certain cases, even if a term is not described using "first," "second," etc., in the specification, it may still be referred to as "first" or "second" in a claim in order to distinguish different claimed elements from each other.

In the drawing figures, the dimensions of layers and regions may be exaggerated for clarity of illustration. Like reference numerals refer to like elements throughout. The same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises," and/or "comprising" when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or example terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

Figure 2A:
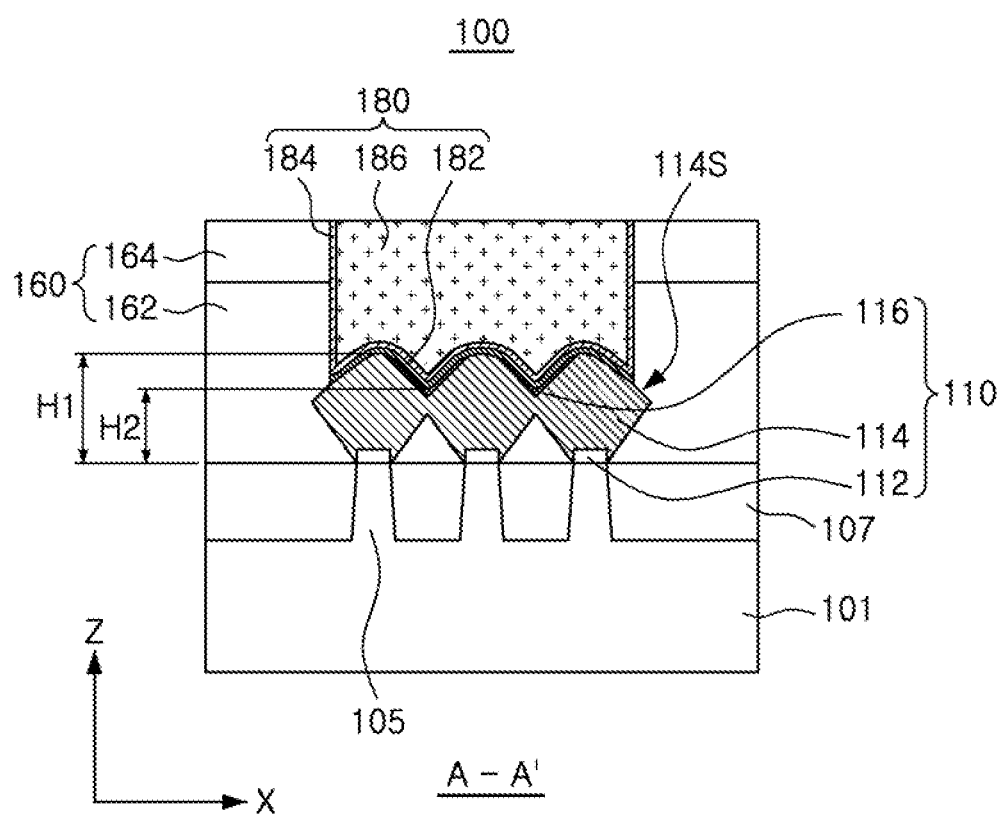
FIGS. 2A through 2C are cross-sectional views of a semiconductor device taken along lines A-A', B-B', and C-C', respectively, according to some example embodiments of the inventive concepts.
Figure 2B:
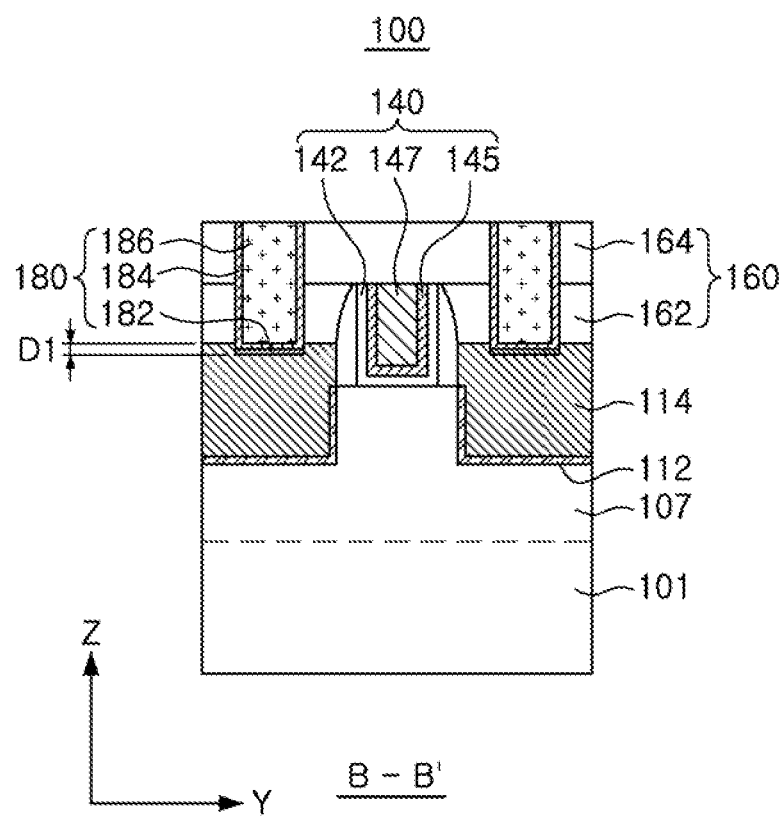
Figure 2C:
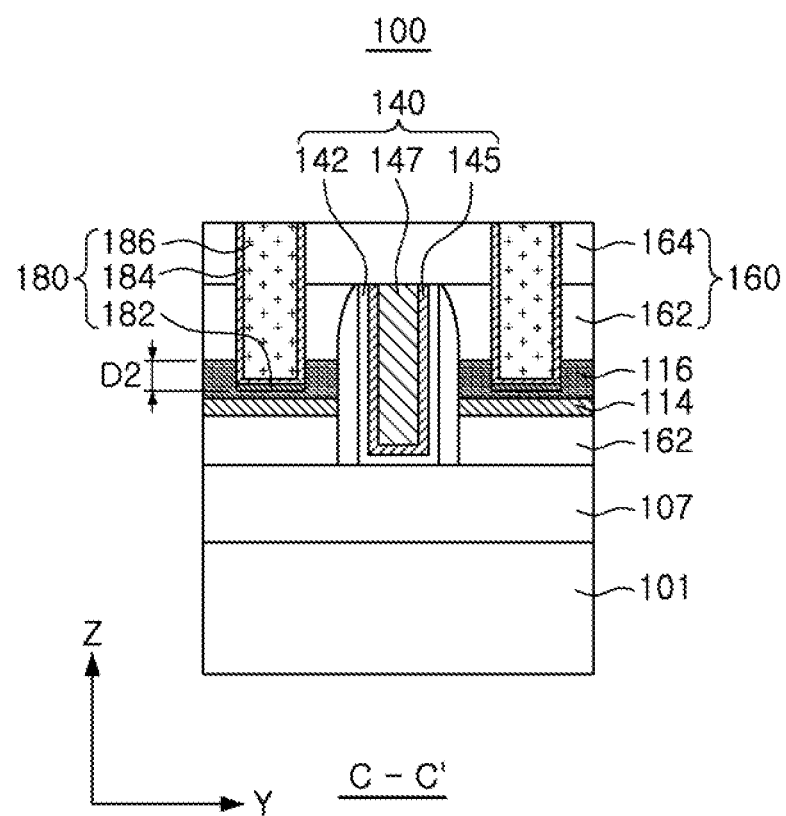

FIG. 1 is a perspective view illustrating a semiconductor device according to an example embodiment of the inventive concepts. FIGS. 2A through 2C are exemplary cross-sectional views of a semiconductor device taken along lines A-A', B-B', and C-C', respectively. For convenience of description, some of elements, such as interlayer insulating layer 160 as shown in FIGS. 2A through 2C, are omitted in FIG. 1.

As used herein, a semiconductor device may refer to any of the various devices such as shown in FIGS. 1-21, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIGS. 1 through 2C, a semiconductor device 100 may include a substrate 101, a plurality of active fins 105, a source/drain region 110, a gate electrode structure 140, and a contact plug 180. The semiconductor device 100 may further include a device isolation region 107, a spacer 150, and an interlayer insulating layer 160. The semiconductor device 100 may be a fin-type field effect transistor (FinFET) including a plurality of active fins which are protruded from the substrate 101. Though various descriptions herein refer to a single contact plug (e.g., 180), source/drain region (e.g., 110), or other items, a plurality of such items may be included, as depicted in the various figures. For example, FIG. 1 and FIGS. 2A-2C show two contact plugs 180, and a plurality of source/drain regions 110 (e.g., two sets of three source/drain regions, one set on each side of gate electrode structure 140), among other items.

The substrate 101 having an upper surface may include a semiconductor material, e.g., a group IV compound semiconductor, a group III-V compound semiconductor, or a group II-VI silicon-oxide semiconductor. For example, the group IV compound semiconductor may include silicon (Si), germanium (Ge), and/or silicon germanium (SiGe).

The plurality of active fins 105 may be defined on the substrate 101 by the device isolation region 107. The device isolation region 107 may be formed of an insulating material. For example, the device isolation region 107 may be formed by a shallow trench isolation (STI) process. The device isolation region 107 may include, for example, silicon oxide and/or silicon nitride.

The plurality of active fins 105 may extend in a first direction (Y-direction). The active fins 105 may have a fin-type shape that is protruded from the substrate 101. The active fins 105 may be a part of the substrate 101 or an epitaxial layer grown from the substrate 101 by an epitaxial growth process. The active fins 105 may have recessed regions at both sides of the gate electrode structure 140. The source/drain region 110 may be formed in and on the recessed regions of the active fins 105.

A source/drain region 110 may be formed at both sides (e.g., opposite sides) of the gate electrode structure 140 and on an active fin 105. Each source/drain region 110 may be an elevated structure for which an upper surface of the source/drain region 110 has a height higher than the bottom of the gate electrode structure 140. At least a cross-sectional portion of each source/drain region 110 may have a pentagonal shape. However, the disclosed embodiments shall not be restricted or limited thereto. For example, the cross-sectional portion of the source/drain region 110 may have a different type of polygonal shape (e.g., rectangular), or a circular shape. Each source/drain region 110 may be merged or connected to adjacent source/drain regions. For example, FIGS. 1 and 2A show three source/drain regions connected to each other on one side of a gate electrode structure 140, and three corresponding source/drain regions connected to each other on a second, opposite side of the gate electrode structure 140. However, the numbers of merged source/drain regions, such as that shown in FIG. 1, are not limited thereto.

The fin-type field effect transistor may include a channel region and the source/drain region 110. The source/drain region 110 may include, for example, silicon (Si) or silicon germanium (SiGe). The source/drain region 110 may include an epitaxial layer. If the source/drain region 110 includes silicon germanium (SiGe), the source/drain region 110 may induce compressive stress to the channel region, and thereby the mobility of holes may be increased in the channel region of the fin-type field effect transistor.

The source/drain region 110 may include a first, a second, a third region 112, 114, and 116 which have different concentrations of base material and/or impurity from each other. These regions may be referred to as different impurity concentration regions. For example, regions described as having different impurity concentration do not have the same impurity concentrations. Also, in certain embodiments, such as when these regions are formed of SiGe, each region may have a different concentration of Ge (and thus Si). In this example, Si and Ge are referred to as base materials (as opposed to impurities), and wherein two base materials form the source/drain regions 110, the different regions within the source/drain regions 110 may have different base material concentrations or ratios, in addition to, or aside from, any difference in impurity concentration.

The first region 112 may be formed on each of the active fins 105. Thus, a plurality of first regions 112 may be formed on a plurality of respective active fins 105. The second region 114 may be grown from each of the first regions 112, for example, by using an epitaxial growth process. Adjacent second regions 114 may be connected to each other as shown FIGS. 1 and 2A. In an example embodiment, the second regions 114 may be separated from each other.

A combined region of the first and second regions 112 and 114 may have a pentagonal shape. The combined region may therefore include sub-regions each including a different impurity concentration. An upper surface of the second region 114 may have a plurality of inclined planes 114S with respect to the upper surface of the substrate 101. The inclined planes 114S may be one of crystallographic planes. For example, if the second region 114 includes silicon germanium (SiGe), the inclined planes 114S may be a (111)-plane or an equivalent plane.

The third region 116 may be disposed on an upper portion of the second region 114 or the whole upper portion of the second region 114. The second region 114 may be plural and be separately formed on each of the first regions 112. The third region 116 may act as a connection region between each of the second regions 114. In detail, the third region 116 may be disposed on the inclined planes 114S of the second region 114. As such, in some embodiments, the third region 116 does not contact the substrate 101. An upper surface of the third region 116 may be a flat surface or a curved surface with respect to the upper surface of the substrate 101. As depicted in FIGS. 1 and 2A, the third region 116 may partially fill in a valley formed by adjacent inclined slopes of first and second regions 112 and 114 of adjacent source/drain regions 110.

In certain embodiments, the first through third regions 112, 114, and 116 may have different base material concentrations and/or different impurity concentrations from each other. For example, in a case where SiGe is used, the first region 112 may have a first germanium (Ge) concentration, the second region 114 may have a second germanium (Ge) concentration greater than the first germanium (Ge) concentration, and the third region 116 may have a third germanium (Ge) concentration greater than the second germanium (Ge) concentration.

In some embodiments, the first germanium (Ge) concentration may be equal to or less than 30 at. % (atomic percentage). The second germanium (Ge) concentration may have a range of about 20 at. % to about 60 at. %. The third germanium (Ge) concentration may have a range of about 50 at. % to about 80 at. %. However, it shall not be restricted or limited thereto. The percentages selected may be used such that the first region 112 has a first germanium (Ge) concentration, the second region 114 has a second germanium (Ge) concentration greater than the first germanium (Ge) concentration, and the third region 116 has a third germanium (Ge) concentration greater than the second germanium (Ge) concentration.

In an example embodiment, the first region 112 may have a first boron (B) concentration, the second region 114 may have a second boron (B) concentration greater than the first boron (B) concentration, and the third region 116 may have a third boron (B) concentration greater than the second boron (B) concentration. Other impurities can be used instead of boron (B) in the examples given herein, such as phosphorus (P).

The first through third regions 112, 114, and 116 may include at least one different impurity with respective to each other. The impurity concentrations of the first through third regions 112, 114, and 116 may be different from each other.

In sections of this specification, the combined region of first and second regions 112 and 114 may be referred to as a first region, in relation to region 116, which may be referred to as a second region.

The gate electrode structure 140 may be disposed on the active fins 105. The gate electrode structure 140 may cross the active fins and extend in a direction. The gate electrode structure 140 may include a gate dielectric layer 142, a first gate electrode 145, and a second gate electrode 147.

The gate dielectric layer 142 may be disposed between the active fins 105 and the first and second gate electrodes 145 and 147. The gate dielectric layer 142 may include silicon oxide, silicon nitride, or high-k dielectric material. The high-k dielectric material may have a dielectric constant higher than that of a silicon dioxide ($SiO_2$) layer. For example, the high-k dielectric material may be aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and/or praseodymium oxide ($Pr_2O_3$).

In an embodiment, the gate dielectric layer 142 may be formed below and on both sides of the first gate electrode 145. In another embodiment, the gate dielectric layer 142 may be formed only below the first gate electrode 145.

The first and second gate electrodes 145 and 147 may be sequentially formed on the gate dielectric layer 142. A channel region may be formed in an upper portion of the substrate 101. The channel region may be overlapped by the first and second gate electrodes 145 and 147. The first and second gate electrodes 145 and 147 may include different material from each other. For example, the first gate electrode 145 may include titanium nitride (TiN), tantalum nitride (TaN), tungsten nitride (WN), and/or other metal nitride. The second gate electrode 147 may include aluminum (Al), tungsten (W), molybdenum (Mo), or other metal. The second gate electrode 147 may also include doped polysilicon. The first gate electrode 145 may act as a diffusion barrier layer for the second gate electrode 147. In an example embodiment, the gate structure 140 may include a single gate electrode, i.e., a monolayer. However, it shall not be restricted or limited thereto.

The spacer 150 may be disposed on both (e.g., opposite) sides of the gate structure 140. The spacer 150 may isolate the source/drain region from the first and second gate electrodes 145 and 147. The spacer 150 may include silicon oxide, silicon nitride, and/or silicon oxynitride, for example. In an example embodiment, the spacer 150 may be a bilayer including a silicon nitride layer and a low-k dielectric layer.

The contact plug 180 may be disposed on the source/drain region 110 and act as an electrical element for inducing a bias voltage to the source/drain region 110. The contact plug 180, also referred to as a conductive plug as it forms an electrical connection to the source/drain region, may have an elongated shape in a top view. For example, the contact plug 180 may extend in a direction (X-direction) along the gate electrode structure 140. In a top view, the contact plug 180 may have a rectangular shape or an elliptical shape.

The contact plug 180 may pass through a first interlayer insulating layer 162 and a second interlayer insulating layer 164. The contact plug 180 may contact the source/drain region 110. An upper surface of the source/drain region may include a recessed region that has a depth range of a first depth D1 to a second depth D2. The bottom of the contact plug 180 may contact to the recessed region. The depth of the recessed region may be variable according to the upper level of the source/drain region 110 as shown in FIGS. 2B and 2C. However, it shall not be restricted or limited thereto.

The bottom surface of the contact plug 180 may have a curved shape or a wave shape along the upper surfaces of the second and third regions of the source/drain region 110. The bottom surface of the contact plug 180 may have a first portion and a second portion. The first portion of the bottom surface may have a first height H1 from the upper surface of the substrate 101 and the second portion of the bottom surface may have a second height H2 from the upper surface of the substrate 101. The first portion of the bottom surface may be a center portion of the second region 114. The second portion of the bottom surface may be a center portion of the third region 116. The second height H2 may be less than the first height H1. The curved or wave shape may be formed by different etch selectivity between the second region 114 and the third region 116 when forming a contact hole for the contact plug 180, and will be described in detail referring to FIGS. 17A through 17C.

Contact area between the contact plug 180 and the source/drain region 110 may be increased when the upper surface of the source/drain region 110 has the curved or wave shape rather than a flat shape. In an example embodiment, when the third region 116 includes higher germanium (Ge) concentration, then a Schottky barrier level between the contact plug 180 and the source/drain region may be relatively lower.

The contact plug 180 may include, for example, a silicide layer 182, a first conductive layer 184, and a second conductive layer 186. The silicide layer 182 may contact the source/drain region 110. The silicide layer 182 may be formed by performing a chemical reaction, e.g., silicidation, between a portion of the first conductive layer 184 and an upper portion of the source/drain region 110. In an example embodiment, the silicide layer 182 may be omitted.

The silicide layer 182 may be a titanium (Ti) silicide layer. The first conductive layer 184 may act as a diffusion barrier layer for the second conductive layer 186. The first conductive layer 184 may be formed along a sidewall of the contact plug 180 and on the source/drain region 110. The first conductive layer 184 may include a metal nitride layer, e.g., a titanium nitride (TiN) layer, a tantalum nitride (TaN) layer, and/or tungsten nitride (WN) layer. The second conductive layer 186 may include aluminum (Al), cooper (Cu), tungsten (W), and/or molybdenum (Mo).

The interlayer insulating layer 160 may include a first interlayer insulating layer 162 and a second interlayer insulating layer 164. The interlayer insulating layer 160 may be formed on the substrate 101, the source/drain region 110, and the gate electrode structure 140. An upper surface of the interlayer insulating layer 160 may have a height substantially equal to that of the upper surface of the gate electrode structure 140. The first interlayer insulating layer 162 and the second interlayer insulating layer 164 may be formed by using different processes. However, the boundary between the first and second interlayer insulating layers 162 and 164 may not be restricted or limited thereshown in FIGS. 2A through 2C. In an example embodiment, the interlayer insulating layer 160 may be a single layer.

The first interlayer insulating layer 162 and the second interlayer insulating layer 164 may be formed of a dielectric layer, e.g., a silicon oxide layer, a silicon nitride layer, or a silicon oxynitride layer, respectively. The first interlayer insulating layer 162 may include a tonen silazene (TOZ) layer and the second interlayer insulating layer 164 may include tetra-ethyl-ortho-silicate (TEOS) layer.

FIGS. 3 through 6 are perspective views and cross-sectional views illustrating semiconductor devices according to some example embodiments of the inventive concepts.

Figure 3:
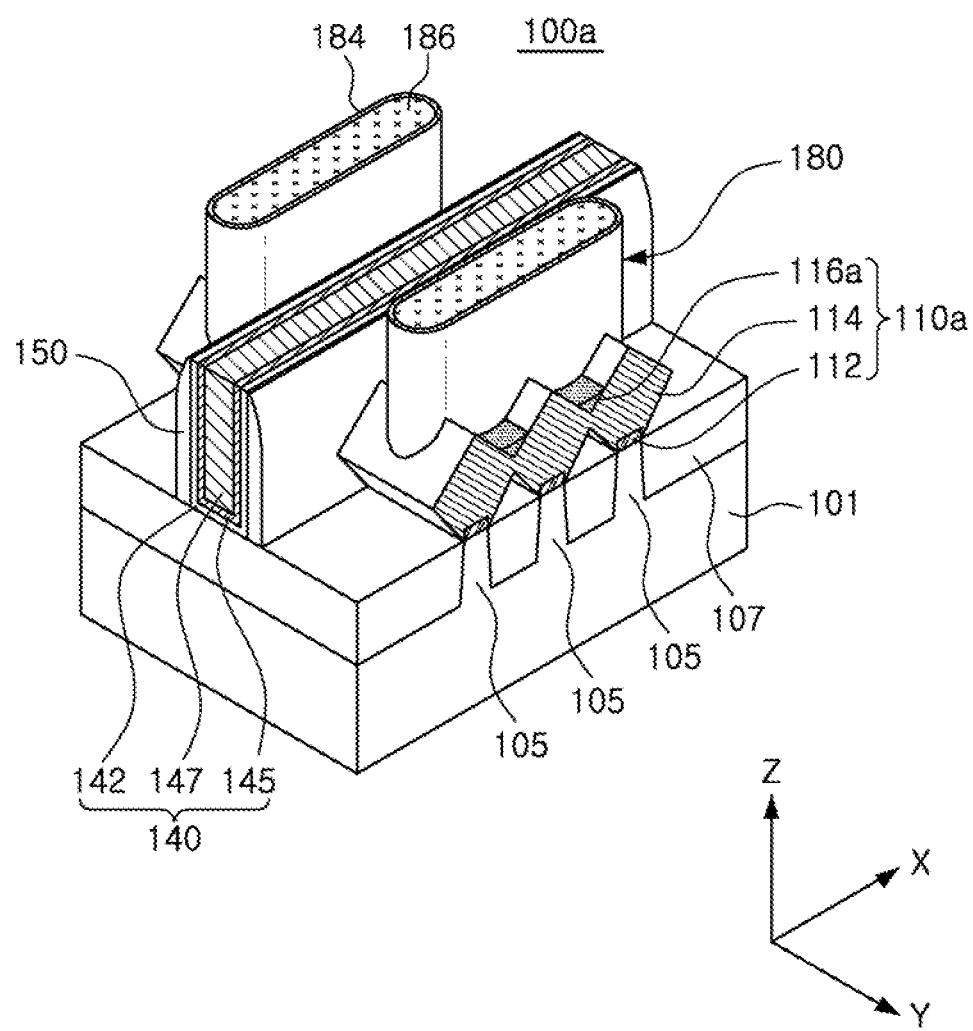
FIGS. 3, 4A, 4B, 5A, 5B, and 6 are perspective views and cross-sectional views illustrating semiconductor devices according to some example embodiments of the inventive concepts.

Referring to FIG. 3, a semiconductor device 100a may include a substrate 101, a plurality of active fins 105, a plurality of source/drain regions 110a, a gate electrode structure 140, and a plurality of contact plugs 180. The semiconductor device 100a may further include a plurality of device isolation regions 107 and a spacer 150.

The plurality of source/drain regions 110a may include a first region 112, a second region 114, and a third region 116a. The second region 114 may have inclined upper surface. The semiconductor device 100a, unlike the semiconductor device disclosed in FIG. 1, may include the third region 116a partially formed on the inclined upper surface of the second region 114. Therefore, a portion of the inclined upper surface of the second region 114 may be not covered by the third region 116a. However, it shall not be restricted or limited thereto. A shape of the bottom surface of the contact plug 180 shown in FIG. 3 may be different from that of the bottom surface of the contact plug 180 shown in FIG. 1.

Figure 4A:
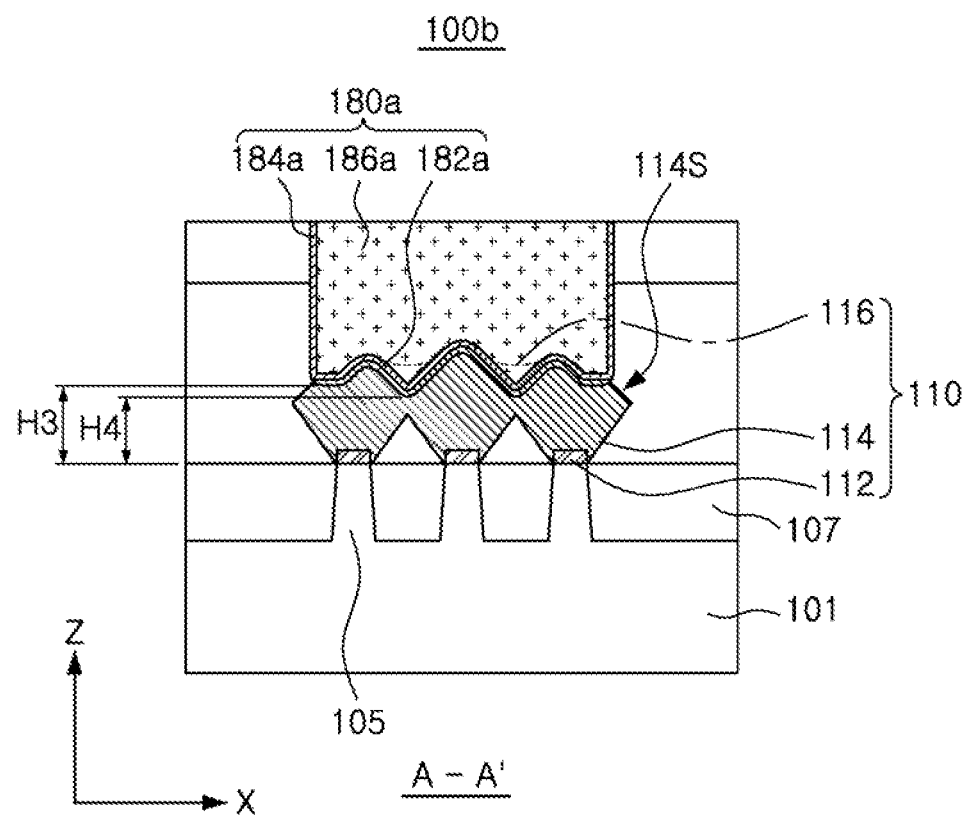
Figure 4B:
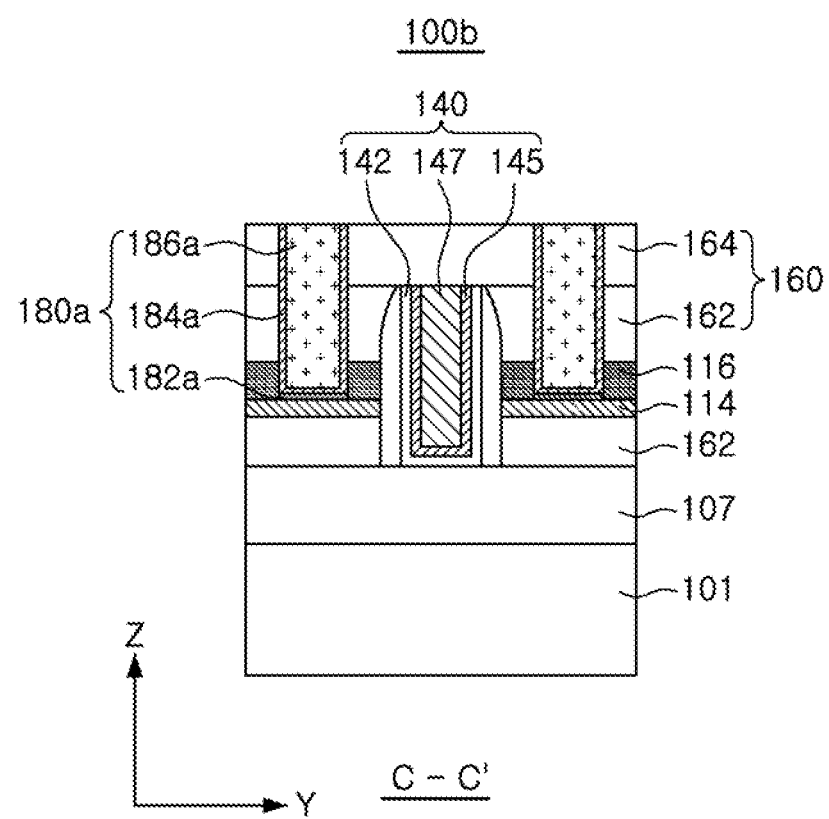

FIGS. 4A and 4B are cross-sectional views corresponding to FIGS. 2A and 2C. A semiconductor device 100b may include a substrate 101, a plurality of active fins 105, a plurality of source/drain regions 110, a gate electrode structure 140, and a plurality of contact plugs 180a. The semiconductor device 100a may further include a plurality of device isolation regions 107 and a spacer 150.

In an example embodiment, the contact plugs 180a may pass through the third regions 116 and may contact with second regions 114 of the source/drain regions 110. The bottom level of the contact plug 180a may vary according to the depths of recesses formed in upper portions of the source/drain regions 110.

The bottom surface of the contact plug 180 may have a first portion having a first height H3 from the upper surface of the substrate 101. The first portion may be a center portion of the second region 114. The bottom surface of the contact plug 180 may have a second portion having a second height H4 from the upper surface of the substrate 101. The second portion may be a center portion of the third region 116 and the second height H4 may be less than the first height H3.

Figure 5A:
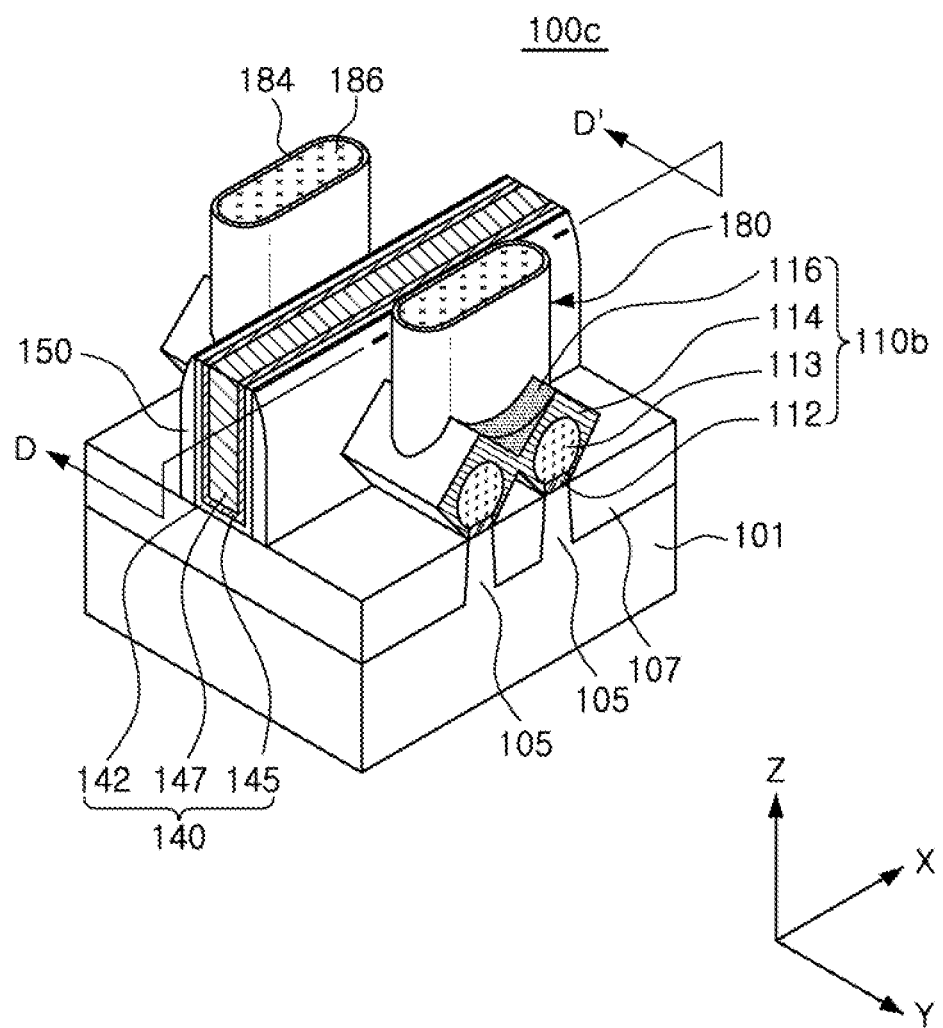
Figure 5B:
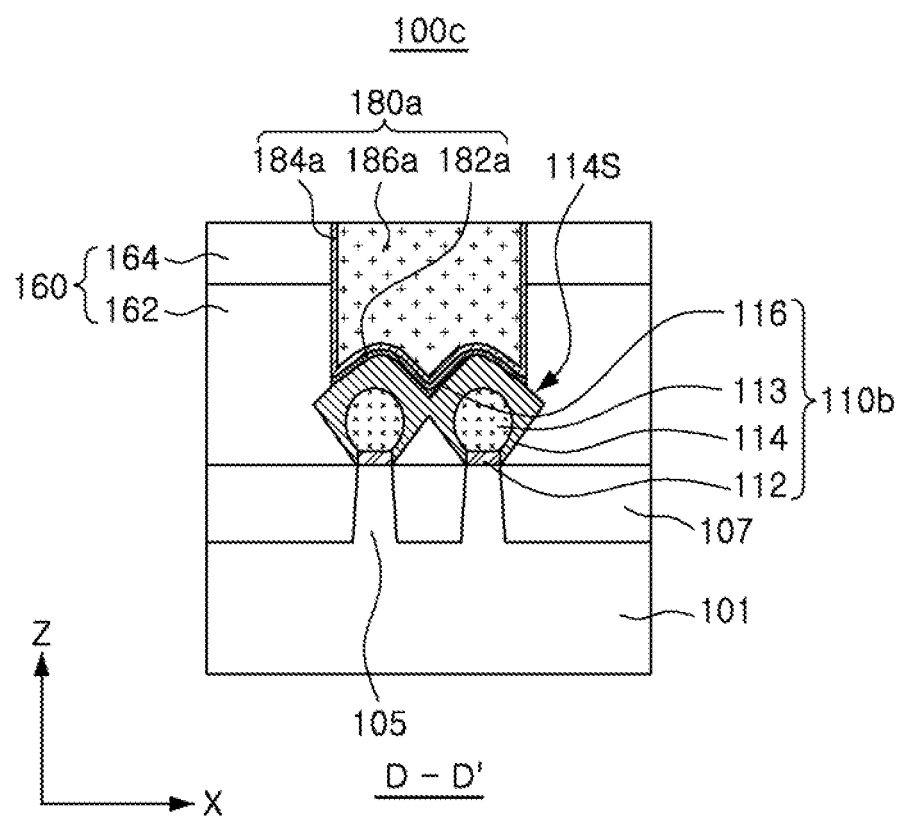

Referring to FIGS. 5A and 5B, FIG. 5B is a cross-sectional view according to line D-D' of FIG. 5A. A semiconductor device 100c may include a substrate 101, a plurality of active fins 105, a plurality of source/drain regions 110b, a gate electrode structure 140, and a plurality of contact plugs 180. The semiconductor device 100c may further include a plurality of device isolation regions 107 and a spacer 150.

The source/drain regions 110b may be disposed on two of the active fins 105 and contact each other. The source/drain regions 110b may include a first region 112, a second region 114, a third region 116, and a fourth region 113. The fourth region may be disposed between the first region 112 and the second region 114. The fourth region 113 may have a circular shape or an elliptical shape in a cross-sectional view. However, it shall not be restricted or limited thereto. The fourth region 113 may have more than one base material and/or may have an impurity. The base material and/or impurity concentration of the fourth region 113 may be different from the first and second regions 112 and 114.

For example, the first region 112 may have a first germanium (Ge) concentration and the fourth region 113 may have a second Ge concentration greater than the first Ge concentration. The second region 114 may have a third Ge concentration greater than the second Ge concentration. The third region 116 may have a fourth Ge concentration greater than the third Ge concentration.

Figure 6:
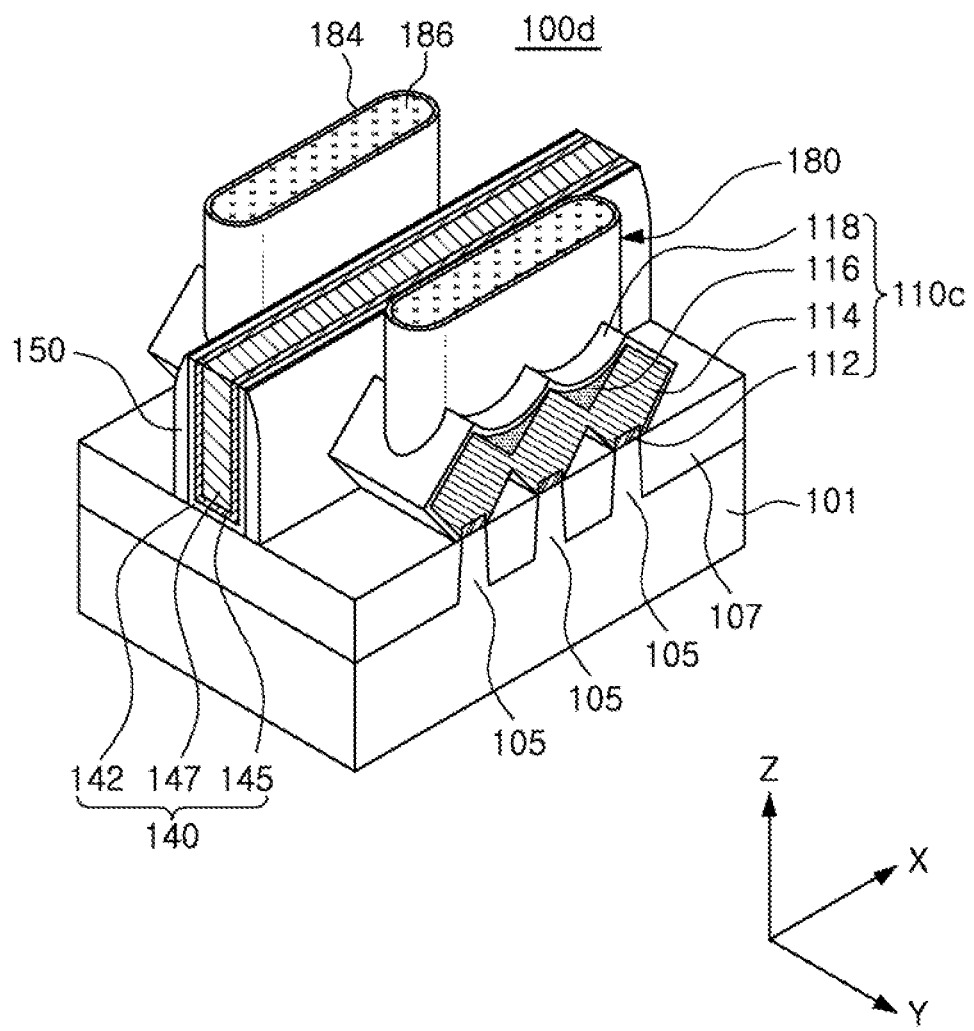

Referring to FIG. 6, a semiconductor device 100d may include a substrate 101, a plurality of active fins 105, a plurality of source/drain regions 110c, a gate electrode structure 140, and a plurality of contact plugs 180. The semiconductor device 100d may further include a plurality of device isolation regions 107 and a spacer 150.

The source/drain regions 110c may include a first region 112, a second region 114, a third region 116, and a fifth region 118. The fifth region 118 may be disposed on the second and third regions 114 and 116. The fifth region 118 may surround upper and outer surfaces of the second and third regions 114 and 116. The thickness of the fifth region 118 may be various and may not be limited there shown in FIG. 6.

The fifth region 118 may have an impurity or base material (either one generally referred to herein as a material) and an impurity or base material concentration (either one generally referred to herein as a material concentration) which are different from the first through third regions 112, 114, and 116.

The fifth region 118 may protect the third region from some damage during the following process. For example, the fifth region 118 may be a silicon capping layer. If the third region 116 includes silicon germanium (SiGe) having a melting point less than silicon (Si), the fifth region 118 formed on the third region 116 may protect the third region 116 from some damage during the following process. In an example embodiment, the fifth region 118 may include a small amount of germanium (Ge).

FIGS. 7 through 18 are perspective views and cross-sectional views illustrating a method of manufacturing a semiconductor device according to an example embodiment of the inventive concept.

Figure 7:
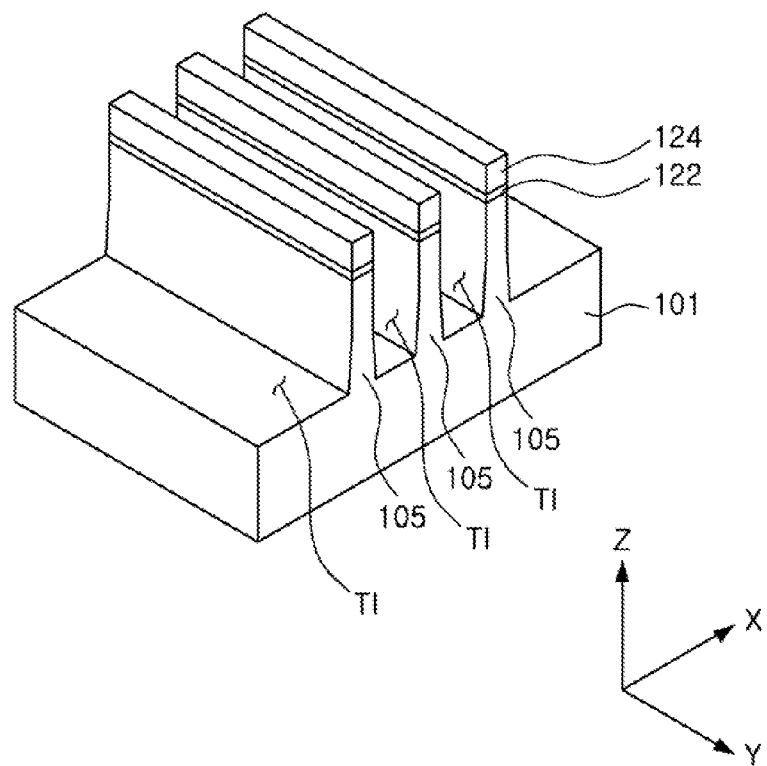
FIGS. 7 through 16, 17A-17C, and 18 are perspective views and cross-sectional views illustrating a method of manufacturing a semiconductor device according to some example embodiments of the inventive concept.

Referring to FIG. 7, a plurality of trenches TI may be formed by patterning a substrate 101 to define a plurality of active fins 105.

In an example embodiment, a method of forming the active fins 105 may include forming a pad oxide layer pattern 122 and a mask pattern 124 on the substrate 101, and performing a anisotropic etching process on the substrate 101 using the pad oxide pattern 122 and the mask pattern 124 as etch masks. The pad oxide layer pattern 122 may be formed to protect an upper surface of the active fins 105. In an example embodiment, the pad oxide layer pattern 122 may be omitted.

The mask pattern 124 may include, for example, silicon nitride (SiN) and/or silicon carbide (SiC). The mask pattern 124 may be a multiple layer. In one embodiment, the trenches TI may have a high aspect ratio. Therefore, the width of the trenches TI may decrease from the upper portion to the bottom portion thereof. On the contrary, in an example embodiment, the width of the active fins 105 may increase from the upper portion to the bottom portion thereof.

Figure 8:
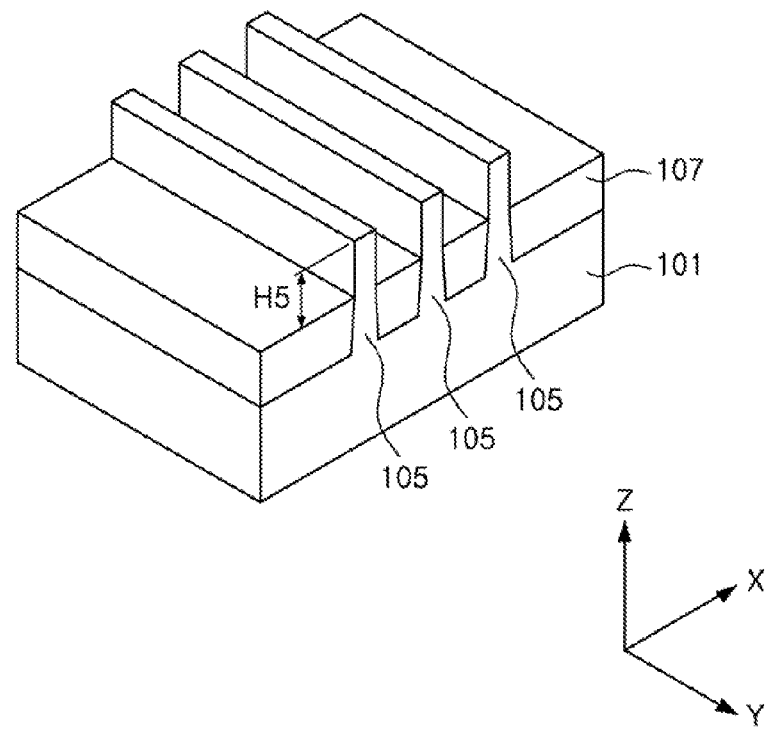

Referring to FIG. 8, a device isolation region 107 may be formed in the trenches TI.

First, the trenches TI may be filled by an insulating layer and a planarization process may be performed on the insulating layer. During the planarization process, the pad oxide layer pattern 122 and the mask pattern 124 may be partially removed. In an example embodiment, a liner may be formed in the trenches TI before filling the trenches TI with the insulating layer.

Second, the planarized insulating layer may be partially removed to expose upper portions of the active fins 105. The planarized insulating layer may be partially removed by using a wet etching process. During the wet etching process, the mask pattern 124 and the pad oxide layer pattern 122 may be removed. Therefore, the active fins 105 may have a height H5 from the upper surface of the device isolation region 107. The height H5 may be varied according to the condition of the wet etching process.

Figure 9:
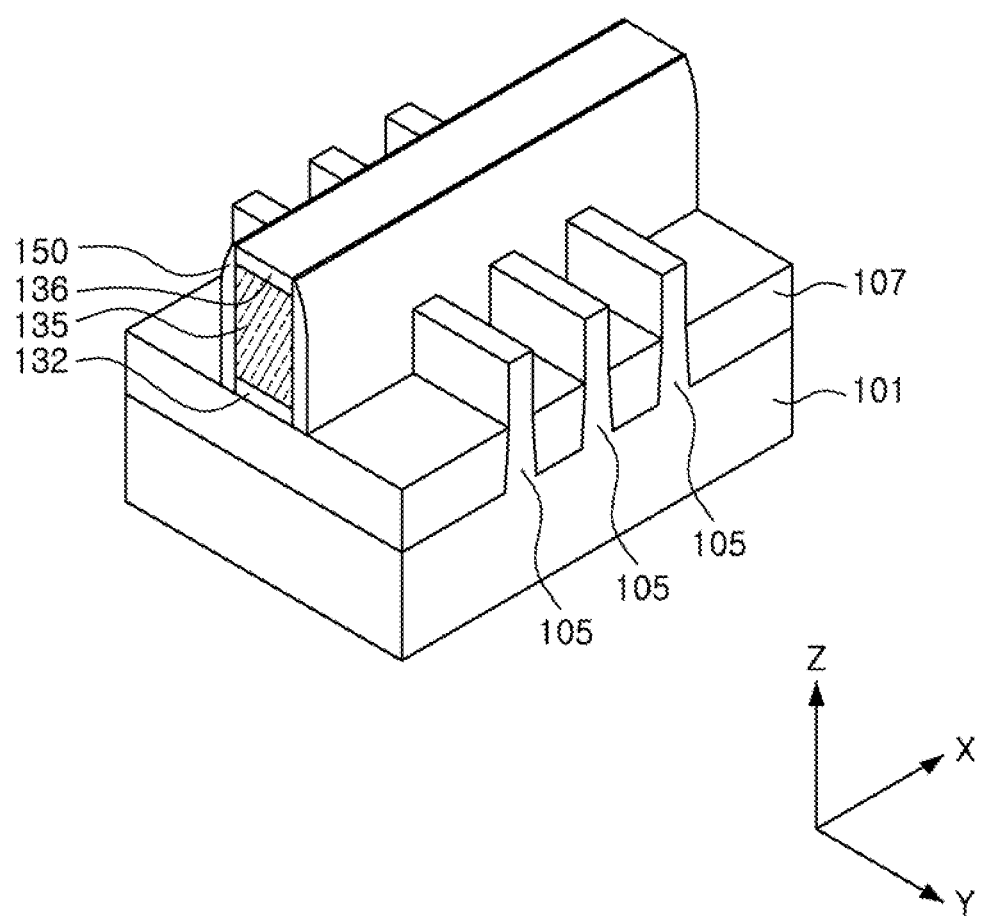

Referring to FIG. 9, a dummy gate dielectric layer 132, a dummy gate electrode 135, and a spacer 150 may be formed on the active fins 105 to cross the active fins 105 and to extend in a direction (e.g., a direction perpendicular to the direction in which the fins extend). The dummy gate dielectric layer 132 and the dummy gate electrode 135 may be formed by performing an etch process using a mask pattern 136 as an etch mask.

The dummy gate dielectric layer 132 may be formed in a region where a gate dielectric layer 142 is to be formed. The dummy gate electrode 135 may be formed in a region where a first gate electrode 145 or a second gate electrode 147 is to be formed. The dummy gate dielectric layer 132 and the dummy gate electrode 135 may be removed by a following process. The dummy gate dielectric layer 132 may include, for example, silicon oxide and the dummy gate electrode 135 may include, for example, polysilicon.

An insulating layer may be on an upper surface of the mask pattern 136 and on sidewalls of the dummy gate electrode 135. The insulating layer may be etched using an anisotropic etching process to form the spacer 150 on the sidewalls of the dummy gate electrode 135. The spacer 150 may include a plurality of stacked layers.

Figure 10:
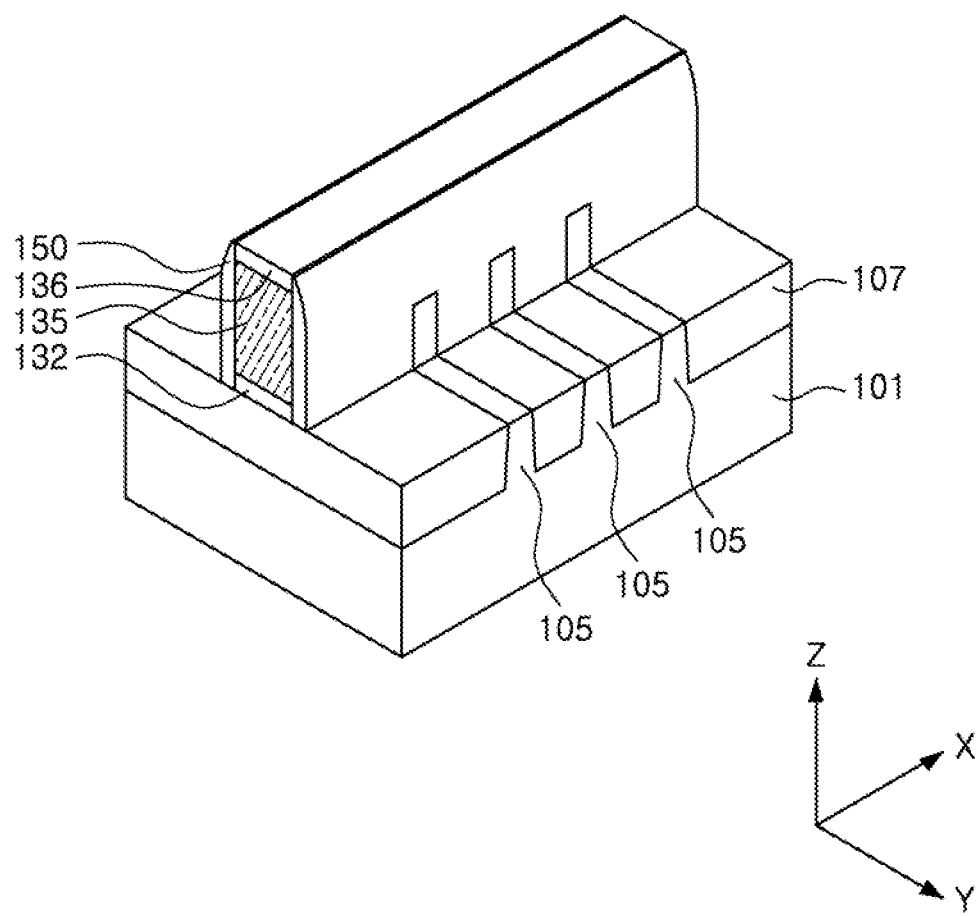

Referring to FIG. 10, some upper portions of the active fins 105 may be selectively removed. A plurality of recesses may be formed in the device isolation region by removing the upper portions of the active fins 105. For example, the plurality of recesses may be formed using sequentially a dry etch process and a wet etch process. A treatment process may be performed for curing the upper surface of the recessed active fins 105. The upper surface of the recessed active fins 105 may have a height equal to the upper surface of the device isolation region 107 as shown in FIG. 10. However, it shall not be restricted or limited thereto. For example, in an example embodiments, the upper surface of the recessed active fins 105 may have a height less or greater than the upper surface of the device isolation region 107.

An ion implantation process may be performed on the active fins 105 before and/or after forming the recesses to inject an impurity to the active fins 105. The ion implantation process may be performed using the mask pattern 136 and the spacer 150 as implantation masks.

Figure 11:
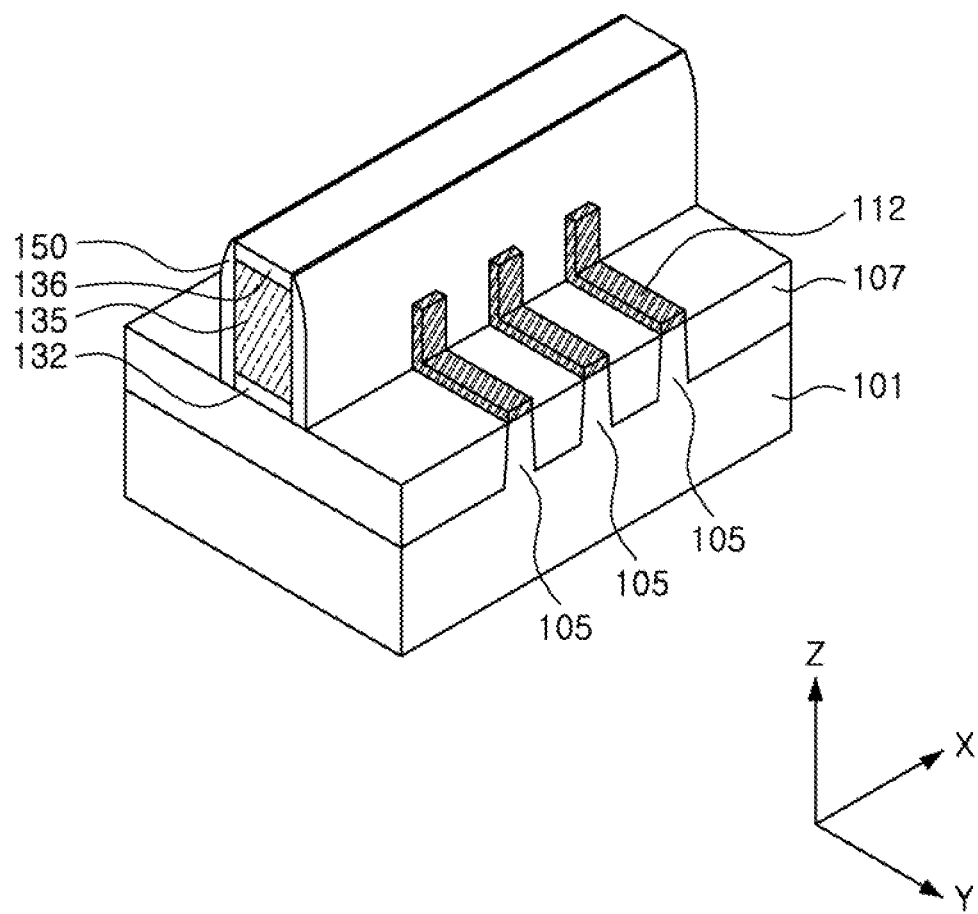

Referring to FIG. 11, a first region 112 of the source/drain region 110 may be formed on the upper surface of the active fins 105 which are disposed at opposite sides of the dummy gate electrode 135.

The first region 112 of the source/drain region 110 may be formed by using a selective epitaxial growth (SEG) process. The first region 112 may include germanium (Ge) and have a first germanium (Ge) concentration. For example, in one embodiment, it may be formed of silicon germanium having a particular germanium concentration.

In an example embodiment, an impurity, such as boron (B) may be in-situ injected into the first region 112 during the SEG process. In an example embodiment, the impurity such as boron (B) may be injected into the first region 112 after forming the first region 112.

Figure 12:
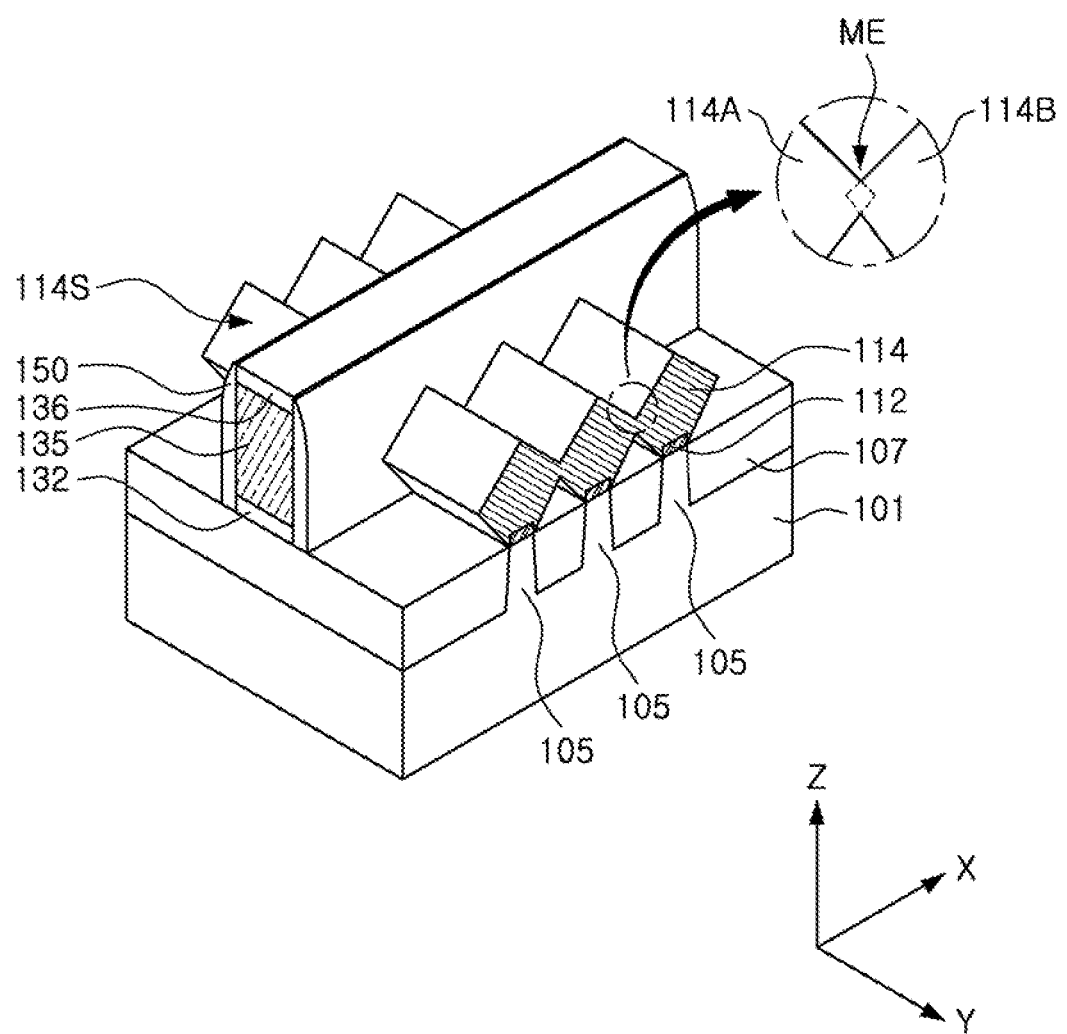

Referring to FIG. 12, a second region 114 of the source/drain region 110 may be formed on the first region 112. The second region 114 may have a pentagonal shape or a hexagonal shape in a cross-sectional view. Therefore, an upper surface 114S of the second region 114 may have an inclined plane with respect to the upper surface of the substrate 101.

The second region 114 may include germanium (Ge), and may also be formed, for example, of silicon germanium. The second region 114 may have a second germanium (Ge) concentration greater than the first germanium (Ge) concentration. The second region 114 may include an impurity, such as boron (B), and may have an impurity (e.g., boron (B)) concentration greater than that of the first region 112. However, it shall not be restricted or limited thereto.

As can be seen from the previous discussion of source/drain regions, the different adjacent second regions 114 may actually form part of separate source/drain regions that are connected or merged. For example, each second region 114A may be merged or connected to adjacent second regions 114B, shown in FIG. 12 by an overlapping section ME.

Figure 13:
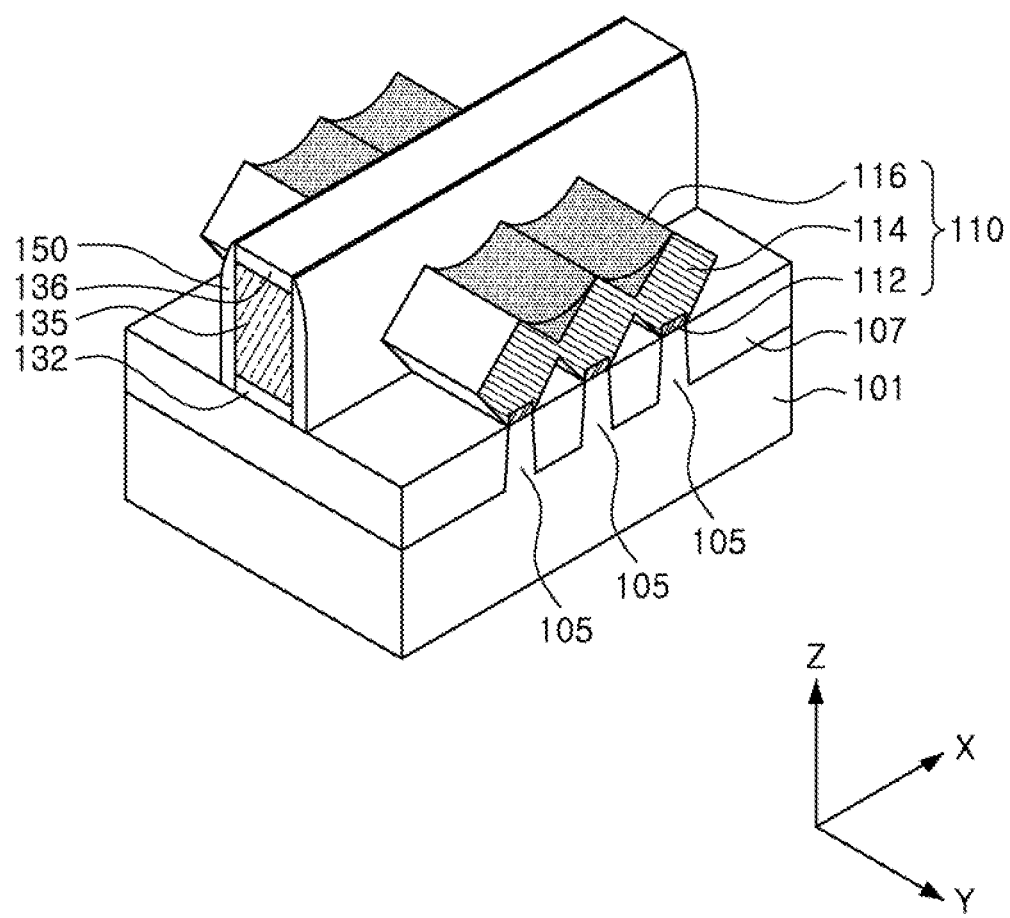

Referring to FIG. 13, a third region 116 of the source/drain region 110 may be formed on the second region 114.

The third region 116 may be formed in a V-shaped region, also described as a valley region, formed by adjacent walls of adjacent second regions 114. The third region 116 may include germanium (e.g., as part of silicon germanium) and may have a third germanium concentration greater than that of the second region 114. The third region 116 may include an impurity such as boron (B), and may have a third boron concentration greater than that of the second region 114. In some embodiments, the third region 116 may be formed at a lower temperature with respect to the second region 114. However, it shall not be restricted or limited thereto.

Therefore, the source/drain region 110 may be formed including the first region 112, the second region 114, and the third region 116.

Figure 14:
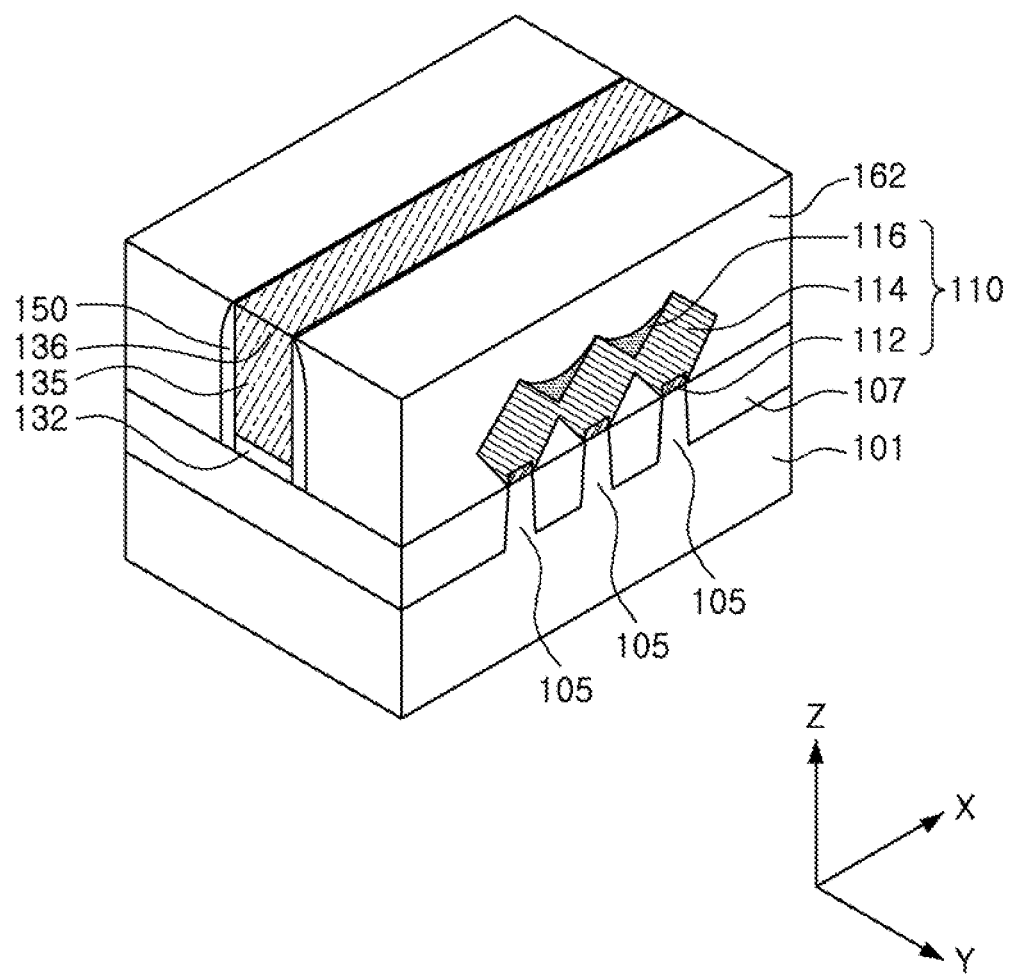

Referring to FIG. 14, a first interlayer insulating layer 162 may be formed on the source/drain region 110.

The first interlayer insulating layer 162 may be formed on the mask pattern 136, the spacer 150, and the source/drain region 110. A planarization process may be performed on the first interlayer insulating layer 162 to expose an upper surface of the dummy gate electrode 135. The mask pattern 136 may be removed during the planarization process. The first interlayer insulating layer 162 may include at least one of silicon oxide, silicon nitride, and/or silicon oxynitride.

Figure 15:
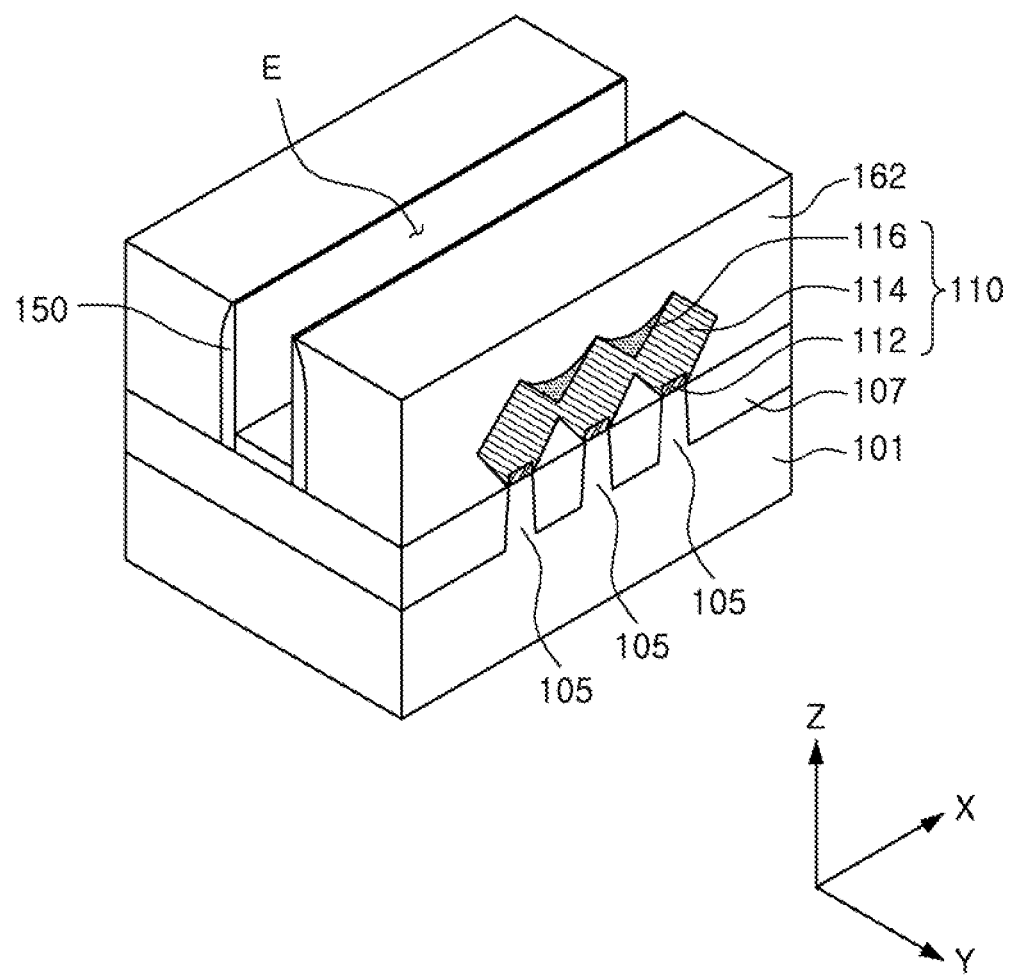

Referring to FIG. 15, the dummy gate dielectric layer 132 and the dummy gate electrode 135 may be removed using a selective etching process with respect to the device region 107 and the active fins 105. Therefore, an opening E may be formed. The opening E may expose upper surfaces of the device isolation region 107 and the active fins 105. The selective etching process may be a dry etch process or a wet etch process.

Figure 16:
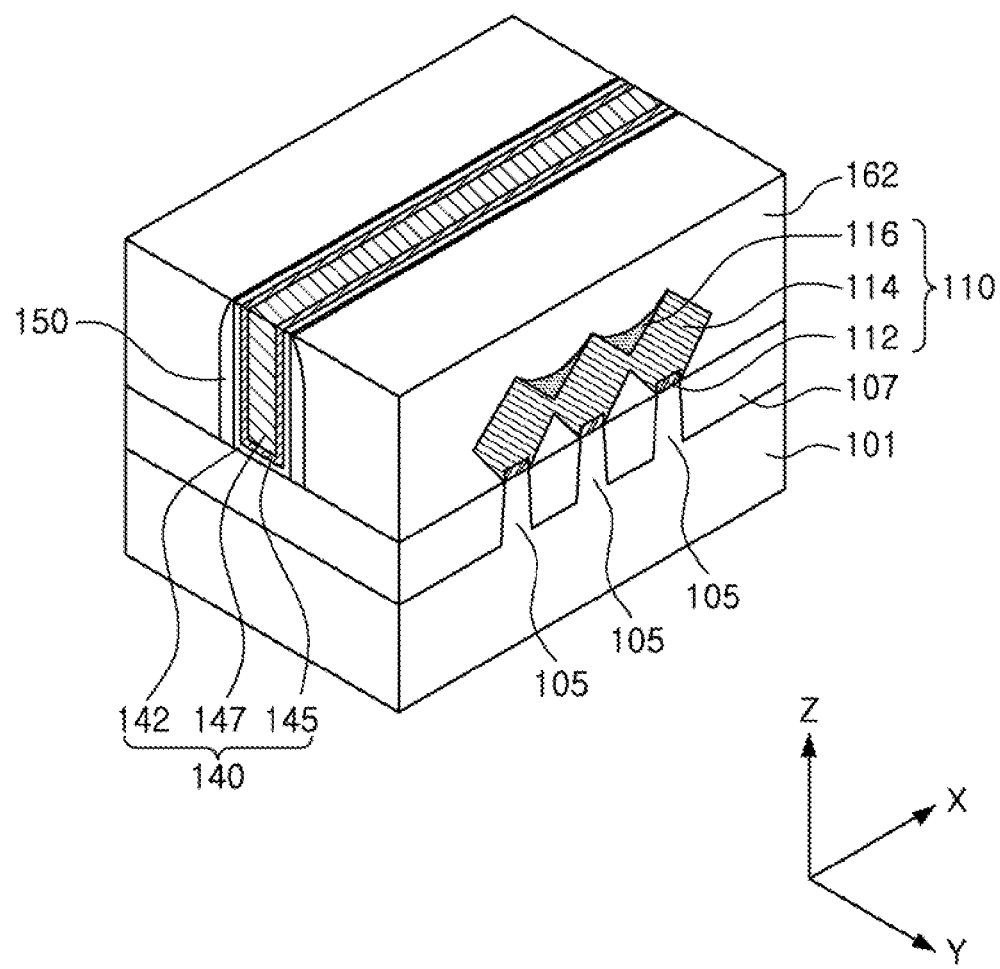

Referring to FIG. 16, a gate dielectric layer 142 may be formed on the active fins 105 in the opening E. A first gate electrode 145 and a second gate electrode 147 may be formed on the gate dielectric layer 142 in the opening E.

The gate dielectric layer 142 may be conformally formed along the sidewalls and bottom of the opening E. The gate dielectric layer 142 may include, for example, silicon oxide, silicon nitride, and/or high-k dielectric material. The first and second gate electrodes 145 and 147 may include metal or semiconductor material.

Figure 17A:
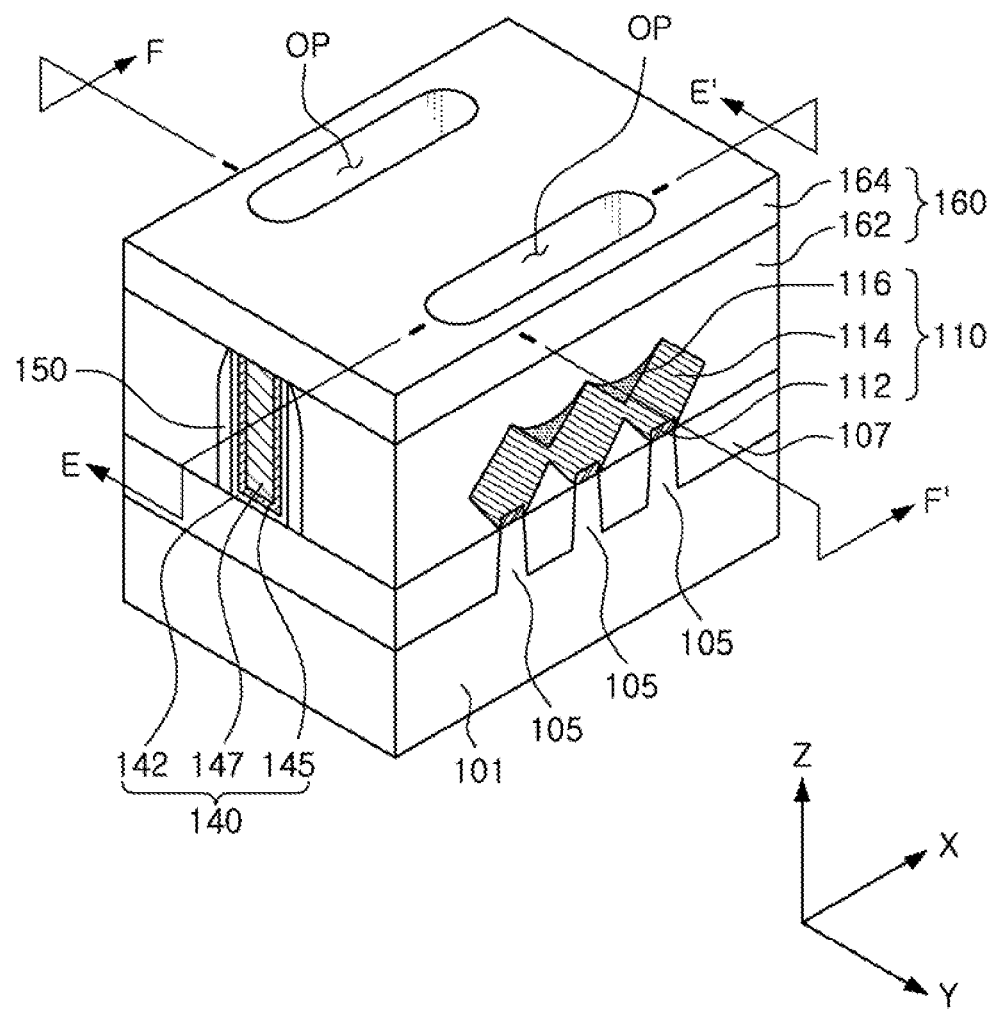
Figure 17B:
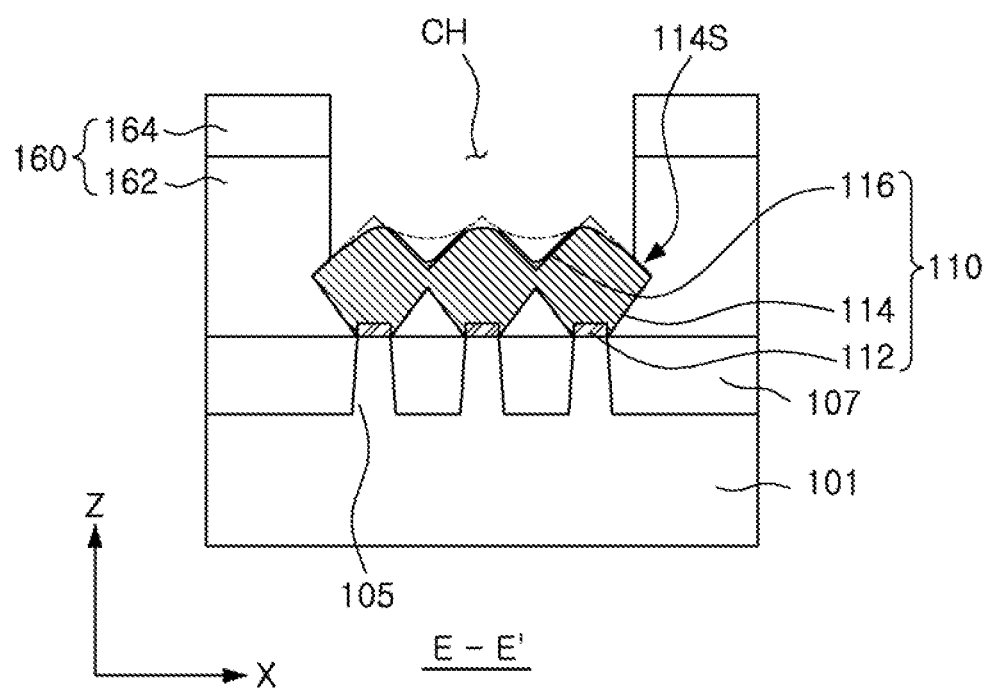
Figure 17C:
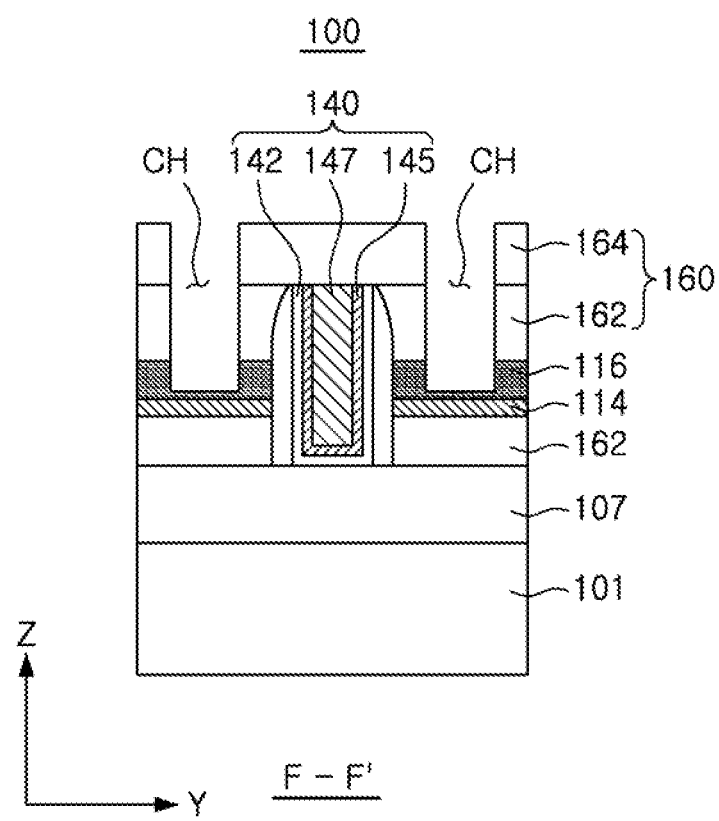

Referring to FIGS. 17A through 17C, FIGS. 17B and 17C are cross-sectional views taken along line E-E' and F-F' of FIG. 17A, respectively.

A second interlayer insulating layer 164 may be formed on the first interlayer insulating layer 162. A plurality of contact holes OP may be formed in the first and second interlayer insulating layers 162 and 164.

The plurality of contact holes OP may be formed by patterning the first and second interlayer insulating layers 162 and 164 using a photoresist pattern as an etch mask to expose an upper surface of the source/drain region 110. During the formation of the contact holes OP, some upper portion of the source/drain region 110 may be partially recessed. The bottom surface of the contact holes OP may have a curved shape.

The second region 114 of the source/drain region 110 may have different concentration of at least one element from that of the third region 116. The second region 114 of the source/drain region 110 may have an impurity concentration and/or a base material concentration different from that of the third region 116. For example, in some embodiments, the second region 114 and the third region 116 may have different germanium concentrations from each other.

If the germanium concentration of the third region 116 is greater than the germanium concentration of the second region 114, the etch rate of the third region 116 may be greater than that of the second region 114 during the formation of the contact holes OP. Therefore, the upper surface of the third region 116 may be more removed than the upper surface of the second region 114. This may result in more rounded or curved surfaces of the top of the source/drain region. As such, the bottom surface of the contact holes OP may have curved shapes. However, it shall not be restricted or limited thereto.

A plurality of contact plugs (180, shown in FIG. 18) may be formed in the contact holes OP and may contact the upper surface of the source/drain region 110. The contact area between the contact plugs 180 and the source/drain region 110 may be increased compared to a flat upper surface of a source/drain, because the upper surface of the source/drain region 110 has a curved shape. In some embodiments, for example, the surface area may be increased between 5% and 20% based on the curved shape of the upper surface of the source/drain region 110, compared to is the upper surface were flat. If the contact plugs 180 are connected to the third region 116, a Schottky Barrier level at the contact area may be increased and a resistance of the contact area may be reduced because the third region 116 has a high germanium concentration with respect to the first or second regions 112 or 114. Furthermore, if the third region 116 has a high boron (B) concentration, it may also affect to Schottky barrier level of the contact area and the resistance of the contact area may be reduced.

Figure 18:
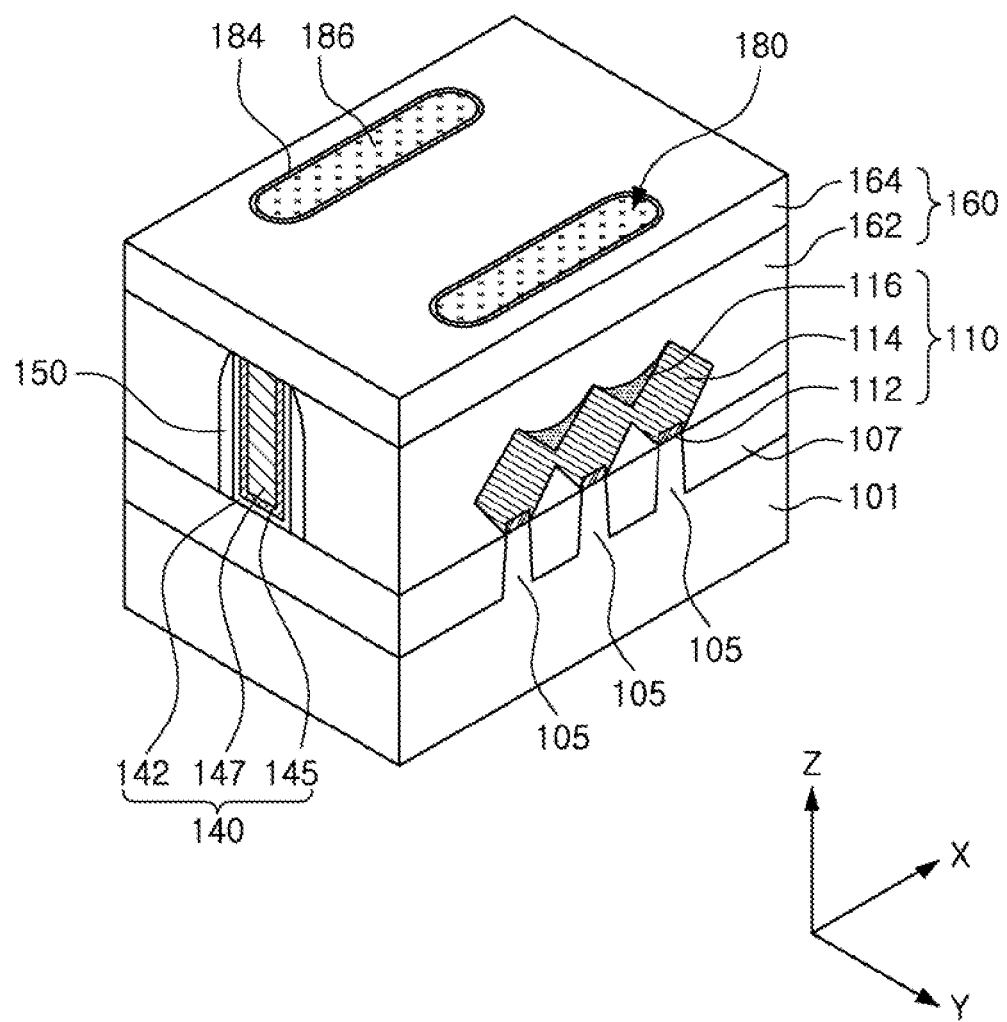

Referring to FIG. 18, the plurality of contact plugs 180 may be formed by filling the contact holes OP with a conductive material.

The conductive material may be a multiple layer. For example, the conductive material may include a first conductive layer 184 and a second conductive layer 186. The first conductive layer 184 and the second conductive layer 186 may be sequentially formed in the contact holes OP. A silicide layer 182 (shown in FIG. 2A) may be formed between the first conductive layer 184 and the source/drain region 110. The silicide layer 182 may be formed through a chemical reaction between the first conductive layer 184 and the source/drain region 110.

Figure 19A:
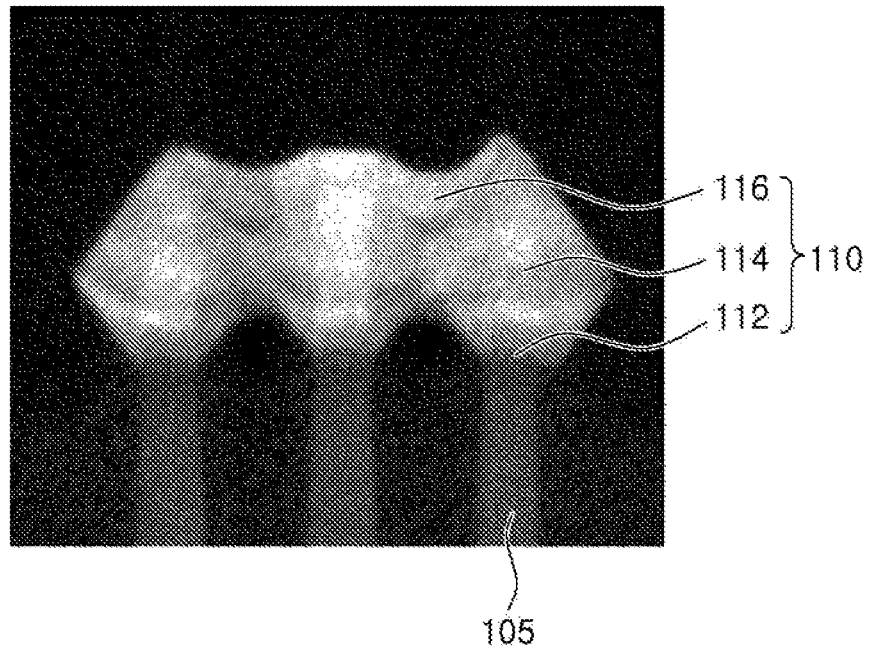
FIGS. 19A and 19B are a cross-sectional electron micrograph showing a portion of a semiconductor device according to some example embodiments of the inventive concept.
Figure 19B:
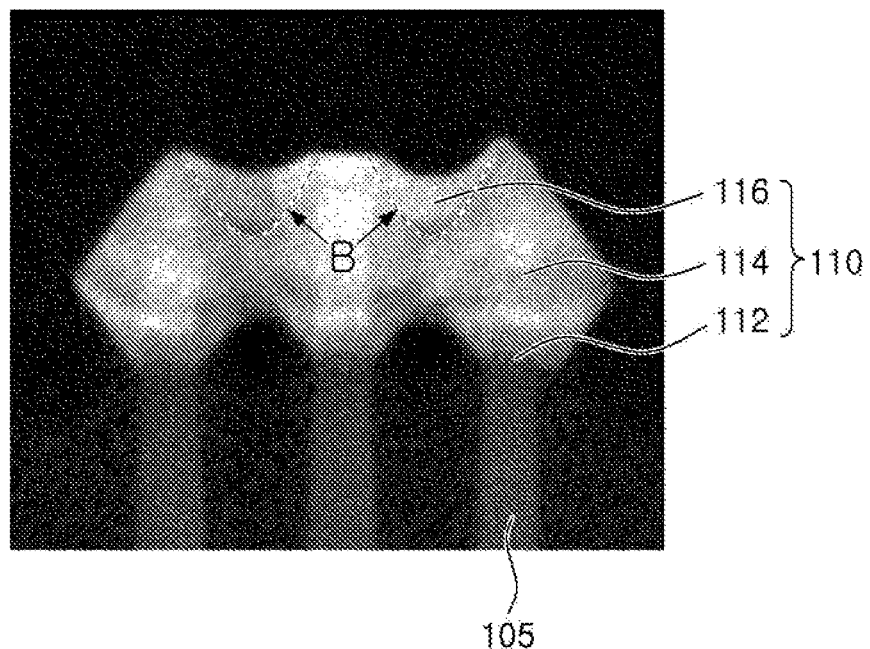

FIGS. 19A and 19B are a cross-sectional electron micrograph showing a portion of a semiconductor device according to an example embodiment of the inventive concept.

Referring to FIGS. 19A and 19B, the electron micrograph was provided using a transmission electron microscope (TEM). FIG. 19A is a cross-sectional view of a source/drain region 110 of a semiconductor device according to an example embodiment of the inventive concept before forming the contact plugs 180. FIG. 19B is the same view, including dotted lines to show boundaries between the different regions.

As can be seen in FIGS. 19A and 19B, the boundary B between the second region 114 and the third region 116 of the source/drain region 110 is shown. As shown in FIGS. 19A and 19B, the third region 116 may be formed on the second regions 114.

Figure 20:
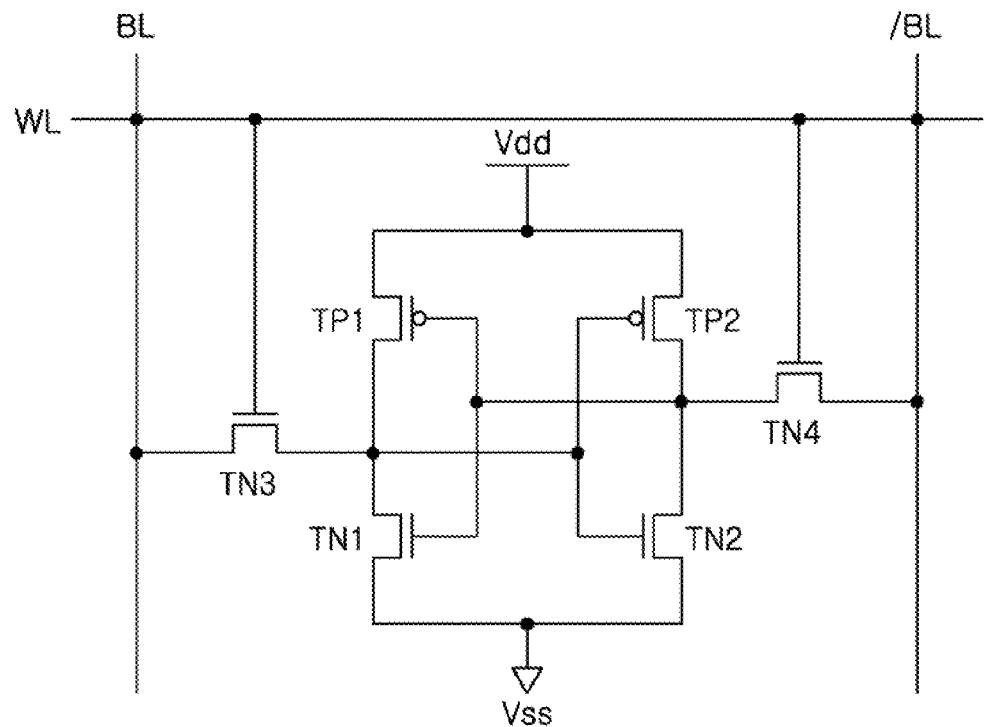
FIG. 20 is a circuit diagram illustrating a SRAM (Static Random Access Memory) according to some example embodiments of the inventive concept.

FIG. 20 is a circuit diagram illustrating a SRAM (Static Random Access Memory) cell according to an example embodiment of the inventive concept. The SRAM cell is an example of a semiconductor device that may include one or more of the disclosed embodiments.

Referring to FIG. 20, the SRAM cell may have a first inverter and a second inverter which are formed between a power supply node Vdd and a ground node Vss. The first inverter, having an input node and an output node, may comprise a first pull-up transistor TP1 and a first pull-down transistor TN1. The second inverter, having an input node and an output node, may have a second pull-up transistor TP2 and a second pull-down transistor TN2. The input node of the first inverter may be connected to a source/drain region of a second pass transistor TN4 as well as to the output node of the second inverter. The input node of the second inverter may be connected to a source/drain region of a first pass transistor TN4 as well as to the output node of the first inverter. Gate electrodes of the first and second pass transistors TN3 and TN4 may be connected to a word line WL. A bit line BL may be connected to a source/drain region of the first pass transistor TN3. A bit line bar/BL may be connected to a source/drain region of the second pass transistor TN4. The first and second pull-up transistors TP1 and TP2 may be PMOS transistors. The first and second pull-down transistors TN1 and TN2 and the first and second pass transistors TN3 and TN4 may be NMOS transistors. The first and second pull-up transistors TP1 and TP2 may be formed according to an example embodiment of the inventive concept. For example, the source/drain regions and contact plugs that connect the source/drain regions to the different nodes shown in FIG. 20 may have a structure according to the various embodiments described herein and may be formed according to the exemplary methods described herein.

In one embodiment, as shown from combined FIGS. 1, 19A, 19B, and 20, a plurality of source/drain regions may be used to connect to a contact plug that connects to a conductive line, such as a bit line. For example, a set of connected source/drain regions having a structure such as shown in FIGS. 1, 19A, 19B, and 20 and formed on respective set of fins may form a single source/drain region that forms a source or drain, and that source or drain may connect to a contact plug that extends along the plurality of source/drain regions that form the source or drain. In certain descriptions herein, each source/drain region of a set of physically connected source/drain regions is referred to as a source/drain sub-region, and the combined set of source/drain regions, which may include regions 112, 114, 116, optionally 113, 116A, or 118, is generally referred to as a source/drain region, or a source/drain, source, or drain.

As such, according to certain embodiments, a set of fins may be physically connected to a first source/drain region formed of a plurality of connected source/drain regions on a first side of a gate electrode structure, and a second source/drain region formed of a plurality of connected source/drain regions on a second, opposite side of the gate electrode structure. Each of the first source/drain region and the second source/drain region (which may be referred to as a first source/drain and second source/drain) may have an upper surface that is formed to have a wave shape, when viewed as a cross-section. The wave shape may have peaks, or high points, at a location corresponding to the fins (e.g., approximately the center of the fins) and low points at a location corresponding to regions between the fins (e.g., approximately midway between fins).

Accordingly, the contact plugs formed to contact a top of the source/drain regions may have a wave shape to correspond to the shape of the top of the source/drain regions. Thus bottom surfaces of the contact plugs may have high points (with respect to the substrate 101) that correspond in location with the fins, and low points (with respect to the substrate 101) that correspond in location with regions between the fins. The contact plugs may have an elongated shape when viewed from a top-down view, which may extend in the same direction as the gate structure positioned between the contact plugs. A surface area of contact between the source/drain region and the contact plug (e.g., the surface area of the top surface of the source/drain region or the bottom surface of the contact plug) may be greater as a result of the wave shape than a surface area of the top surface of the contact plug, which in certain embodiments, is substantially planar. For example, the surface area of contact between the source/drain region and the contact plug may be between 5% and 20% greater as a result of the wave shape than a surface area of the top of the contact plug, or a surface area of a cross-section of the contact plug when viewed from an overhead, Z direction.

Figure 21:
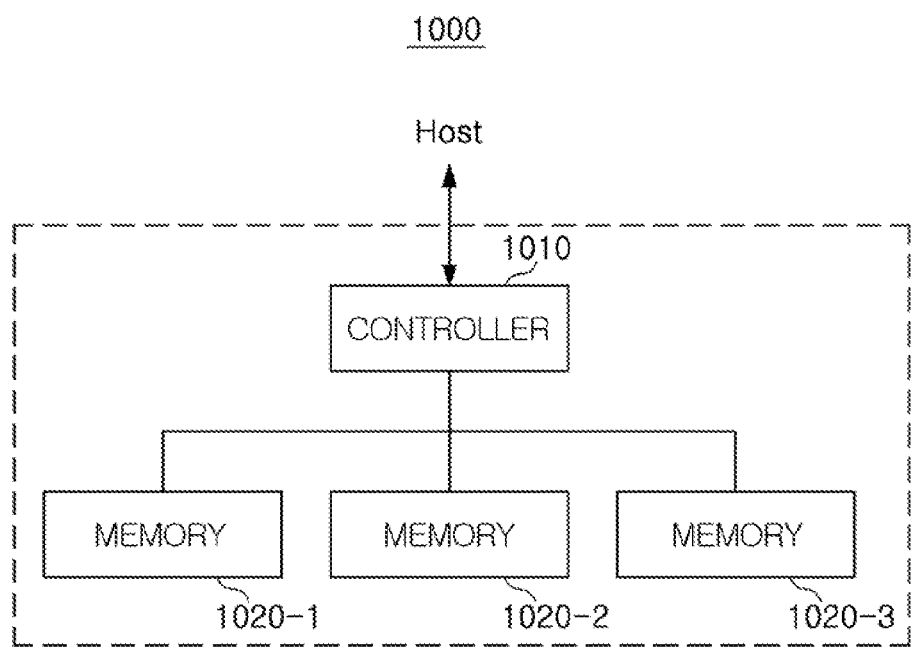
FIG. 21 is a block diagram of a storage device including a semiconductor device according to some example embodiments of the inventive concept.

FIG. 21 is a block diagram of a storage device that may form a semiconductor device according to an example embodiment of the inventive concept.

Referring to FIG. 21, a storage apparatus 1000 according to this example embodiment may include a controller 1010 communicating with a Host, and memories 1020-1, 1020-2 and 1020-3 storing data. The respective memories 1020-1, 1020-2 and 1020-3 may form the semiconductor devices according to various embodiments of the present inventive concept described with reference to FIGS. 1 through 18.

Examples of the host communicating with the controller 1010 may include various electronic devices on which the storage apparatus 1000 is mounted. For example, the host may be, for example, a smartphone, a digital camera, a desktop computer, a laptop computer, a portable media player or the like. The controller 1010 may receive a data writing or reading request transferred from the host to store data in the memories 1020-1, 1020-2 and 1020-3 or generate a command for retrieving data from the memories 1020-1, 1020-2 and 1020-3.

As illustrated in FIG. 21, at least one or more memories 1020-1, 1020-2 and 1020-3 may be connected to the controller 1010 in parallel in the storage apparatus 1000. The plurality of memories 1020-1, 1020-2 and 1020-3 may be connected to the controller 1010 in parallel, whereby the storage apparatus 1000 having high capacity such as a solid state drive may be implemented. The controller 1010, and memories 1020-1, 1020-2, and 1020-3 may be in the form of a memory package (e.g., including a plurality of memory chips stacked on a package substrate), a memory module or in other forms as well.

Figure 22:
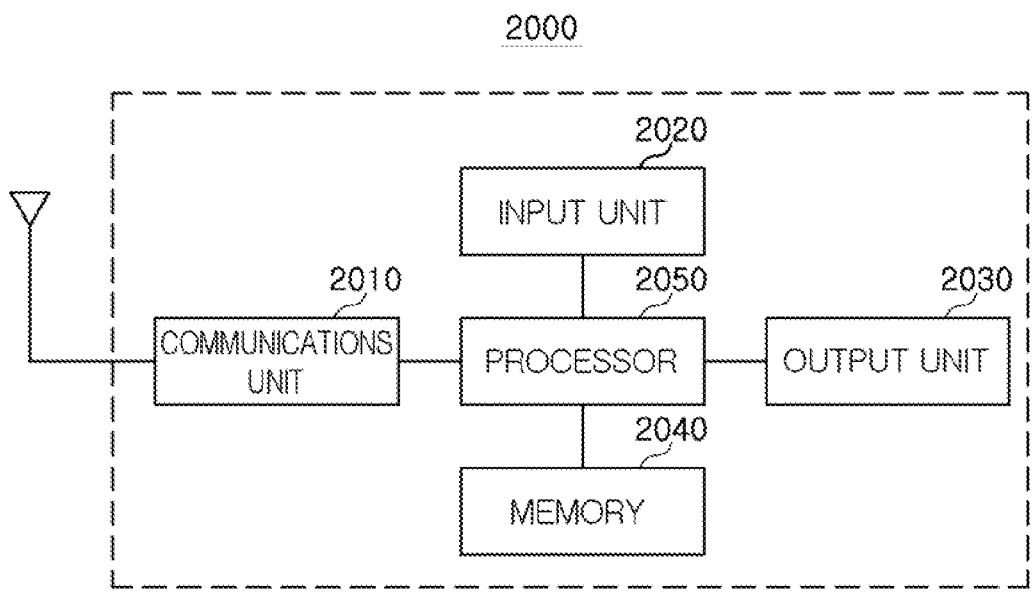
FIG. 22 is a block diagram of an electronic device including a semiconductor device according to some example embodiments of the inventive concept.

FIG. 22 is a block diagram of an electronic device including a semiconductor device according to an example embodiment of the inventive concept Referring to FIG. 22, an electronic apparatus 2000 according to the example embodiment may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module and the like. The wired or wireless communications module included in the communications unit 2010 may be connected to external communications networks according to various communications standard specification to transmit and receive data.

The input unit 2020 may be a module provided to control an operation of the electronic apparatus 2000 by a user and may include a mechanical switch, a touch screen, a voice recognition module, and the like. In addition, the input unit 2020 may include a mouse operating in a track ball or a laser pointer scheme or a finger mouse device. In addition to these, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The memory 2040 may form or include at least one semiconductor device according to various example embodiments of the present inventive concept as described with reference to FIGS. 1 through 18. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards such as SD, SDHC, SDXC, MICRO SD, USB and the like.

The processor 2050 may control operations of respective components included in the electronic apparatus 2000. The processor 2050 may perform control and processing in association with voice communications, video telephony, data communications and the like, or may perform control and processing for multimedia reproduction and management. In addition, the processor 2050 may process an input transferred from a user through the input unit 2020 and may output results thereof through the output unit 2030. In addition, the processor 2050 may store data required in controlling the operation of the electronic apparatus 2000 as described above, in the memory 2040, or fetch data from the memory 2040.

Figure 23:
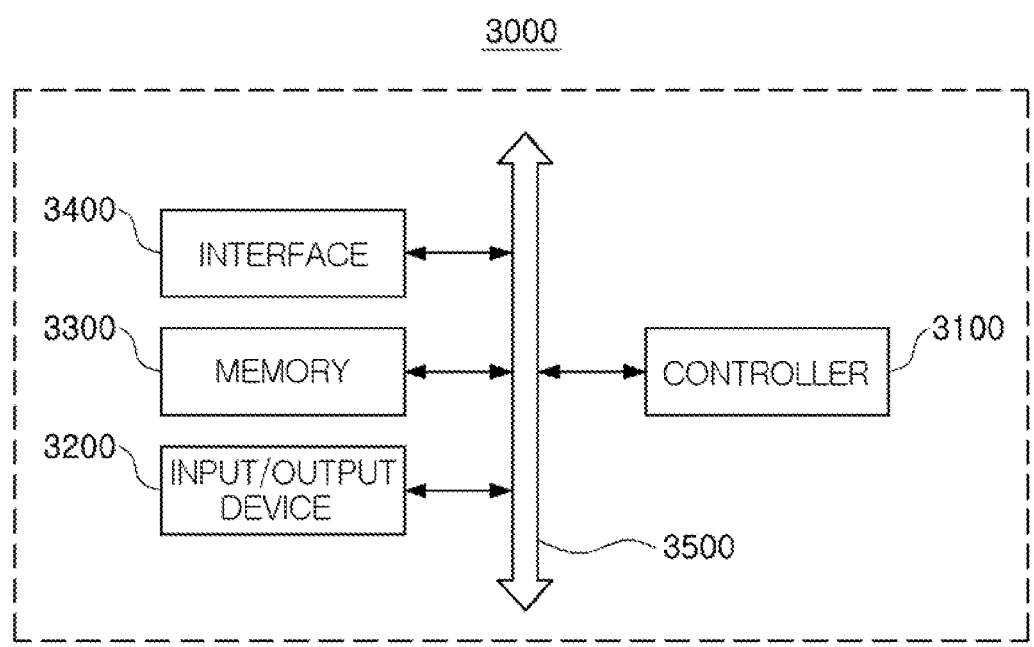
FIG. 23 is a block diagram of a system including a semiconductor device according to some example embodiments of the inventive concept.

FIG. 23 is a block diagram of a system including a semiconductor device according to an example embodiment of the inventive concept Referring to FIG. 23, a system 3000 may be an electronic device that includes a controller 3100, an input/output device 3200, a memory 3300, and an interface 3400. The system 300 may transmit or receive mobile system or information. Examples of the mobile system may include PDAs, portable computers, web tablets, wireless phones, mobile phones, digital music players and memory cards.

The controller 3100 may execute a program and control the system 300. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or networks and may exchange data with the external device. The input/output device 3200 may be a keypad, a keyboard, or a display device.

The memory 3300 may store a code and/or data for operating the controller 3100 and/or store data having been processed by the controller 3100. The memory 3300 may form or include the semiconductor device according to one of the example embodiments of the present inventive concept.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include at least one of the semiconductor devices described with reference to FIGS. 1 through 18.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device, comprising:
a substrate;
a plurality of active fins extending in a first direction on the substrate;
a gate electrode structure crossing the plurality of active fins to extend in a second direction;
a first source/drain region on a first side of the gate electrode structure, a bottom of the first source/drain region extending from the plurality of active fins;
a second source/drain region on a second, opposite side of the gate electrode structure, a bottom of the second source/drain region extending from the plurality of active fins,
wherein a top surface of at least the first source/drain region has a wave shape, and wherein:
the first source/drain region has at least first sub-regions and second sub-regions, each sub-region including germanium and having a germanium concentration, and
the first sub-regions are merged with each other, extend closer to the substrate than the second sub-regions, together include a top surface that has a wave-like shape having peaks and valleys, and have a germanium concentration less than the germanium concentration of the second sub-regions; and
a first contact plug extending upward from the top surface of the first source/drain region, the first contact plug having a bottom surface that has a wave shape corresponding to the wave shape of the top surface of the first source/drain region, and the first contact plug including a first conductive layer and second conductive layer,
wherein the first conductive layer is disposed vertically between the second conductive layer and the first sub-regions, and the second conductive layer is formed at vertical levels lower than portions of the first sub-regions.

2. The semiconductor device of claim 1, wherein:
the first conductive layer of the first contact plug is formed of a metal or metal nitride; and
the second conductive layer of the first contact plug is formed of a metal.

3. The semiconductor device of claim 2, wherein:
the first contact plug has a top surface that has a planar shape.

4. The semiconductor device of claim 2, wherein:
the first contact plug has a top surface opposite the bottom surface; and
the bottom surface of the first contact plug has a greater surface area than the top surface of the first contact plug.

5. The semiconductor device of claim 4, wherein:
the surface area of the bottom surface of the first contact plug is at least 5% greater than the surface area of the top surface of the first contact plug.

6. The semiconductor device of claim 1, wherein:
the first sub-regions have a plurality of inclined planes with respect to a top surface of the substrate to form the wave-like shape, wherein some of the inclined planes are part of the valleys, and some of the inclined planes are not part of any valley;
each second sub-region is disposed between inclined planes of two adjacent first sub-regions that form a valley; and
at least part of each inclined plane that is not part of any valley is not covered by a second sub-region.

7. The semiconductor device of claim 1, wherein the first sub-regions and second sub-regions each include silicon germanium (SiGe).

8. The semiconductor device of claim 7, wherein the first sub-regions include an impurity having a first concentration and the second sub-regions include an impurity having a second concentration different from the first concentration.

9. A semiconductor device, comprising:
a substrate;
a plurality of active fins extending in a first direction on the substrate;
a gate electrode structure crossing the plurality of active fins to extend in a second direction;
a first source/drain on a first side of the gate electrode structure, a bottom of the first source/drain extending from the plurality of active fins;
a second source/drain on a second, opposite side of the gate electrode structure, a bottom of the second source/drain extending from the plurality of active fins; and
a first conductive plug extending upward from a top surface of the first source/drain, the first conductive plug having a bottom surface and a top surface, wherein:
the bottom surface of the first conductive plug has a greater surface area than the top surface of the first conductive plug,
the first source/drain has at least first sub-regions and second sub-regions, each sub-region including germanium and having a germanium concentration, the first sub-regions extend closer to the substrate than the second sub-regions, have a germanium concentration less than the germanium concentration of the second sub-regions, and are merged with each other to have a top surface that has a wave shape including peaks and valleys, wherein the peaks are at a higher vertical level with respect to the substrate than a bottom portion of a conductive layer of the first conductive plug, the conductive layer formed of tungsten, aluminum, copper, or molybdenum, and the second sub-regions are formed in the valleys to each have a gradually reduced thickness from a bottom of each valley toward a top of each adjacent peak.

10. The semiconductor device of claim 9, wherein:

a top surface of at least the first source/drain has a wave shape; and the bottom surface of the first conductive plug has a wave shape corresponding to the wave shape of the top surface of the first source/drain.

11. The semiconductor device of claim 9, wherein:

the surface area of the bottom surface of the first conductive plug is at least 5% greater than the surface area of the top surface of the first conductive plug.

12. The semiconductor device of claim 11, wherein:

the top surface of the first conductive plug has a planar shape.

13. The semiconductor device of claim 9, wherein:

the first sub-regions have a plurality of inclined planes with respect to a top surface of the substrate; and each second sub-region is disposed between two adjacent first sub-regions.

14. A semiconductor device, comprising:

a substrate;

a plurality of active fins on the substrate;

a gate electrode crossing the plurality of active fins;

a first source/drain region on the plurality of active fins at a first side of the gate electrode; and a second source/drain region on the plurality of active fins at a second, opposite side of the gate electrode, wherein at least one of the first or second source/drain region comprises:

a plurality of first regions, each formed of silicon germanium, disposed on the active fins, and having a first germanium concentration, wherein the plurality of first regions are merged with each other to have a top surface that has a wave shape including a plurality of adjacent inclined planes, and a second region formed of silicon germanium and formed between the first regions, such that the first regions are between the second region and the substrate, the second region has a second germanium concentration greater than the first germanium concentration, the silicon germanium having the second germanium concentration is not formed on at least part of the top surface of the merged first regions, and a top surface of the second region is curved.

15. The semiconductor device of claim 14, wherein the second region is disposed on two adjacent planes of the plurality of inclined planes.

16. The semiconductor device of claim 15, wherein at least a cross-sectional portion of the plurality of first regions has a pentagonal shape; and wherein at least some of the first regions are connected to each other by the second region.

17. The semiconductor device of claim 16, wherein a top-most surface of the second region is lower than a top-most surface of the plurality of first regions.

* * * * *